United States Patent
Pietraski et al.

(10) Patent No.: US 11,108,500 B2
(45) Date of Patent: Aug. 31, 2021

(54) LATENCY REDUCTION BY FAST FORWARD IN MULTI-HOP COMMUNICATION SYSTEMS

(71) Applicant: IDAC Holdings, Inc., Wilmington, DE (US)

(72) Inventors: Philip J. Pietraski, Jericho, NY (US); Arnab Roy, Phoenixville, PA (US); Kyle Jung-Lin Pan, Saint James, NY (US); Alpaslan Demir, East Meadow, NY (US); Muhammad U. Fazili, Audubon, PA (US); William E. Lawton, Pottstown, PA (US); Mohamed Abou El Seoud, San Francisco, CA (US); Kevin T. Wanuga, Souderton, PA (US); Ravikumar V. Pragada, Warrington, PA (US)

(73) Assignee: IDAC Holdings, Inc., Wilmington, DE (US)

( * ) Notice: Subject to any disclaimer, the term of this patent is extended or adjusted under 35 U.S.C. 154(b) by 0 days.

(21) Appl. No.: 16/315,234

(22) PCT Filed: Jul. 1, 2017

(86) PCT No.: PCT/US2017/040557
§ 371 (c)(1),
(2) Date: Jan. 4, 2019

(87) PCT Pub. No.: WO2018/009468
PCT Pub. Date: Jan. 11, 2018

(65) Prior Publication Data
US 2019/0165890 A1    May 30, 2019

Related U.S. Application Data

(60) Provisional application No. 62/358,436, filed on Jul. 5, 2016.

(51) Int. Cl.
*H04L 1/00* (2006.01)
*H04L 12/801* (2013.01)
(Continued)

(52) U.S. Cl.
CPC ....... *H04L 1/0063* (2013.01); *H03M 13/1102* (2013.01); *H04B 7/0617* (2013.01);
(Continued)

(58) Field of Classification Search
None
See application file for complete search history.

(56) References Cited

U.S. PATENT DOCUMENTS

| 6,067,569 A | 5/2000 | Khaki et al. |
| 9,264,368 B2 | 2/2016 | Swarbrick et al. |

(Continued)

FOREIGN PATENT DOCUMENTS

WO    WO 2016/057038 A1    4/2016

*Primary Examiner* — Jay L Vogel
(74) *Attorney, Agent, or Firm* — Condo Roccia Koptiw LLP

(57) ABSTRACT

Latency reduction by fast forward (FF) in multi-hop communication device and/or systems is disclosed. Packets may be received and forwarded using a codeword (CW)-based approach with and/or without per-CW CRC. A FF session may have a flow ID and packets may have sequence numbers. Packets targeted for FF may be divided into independently decodable CWs that may be transmitted in the next hop, for example, as soon as the destination is determined without waiting for an entire packet's arrival and/or for CRC verification. Low latency (e.g. FF) traffic may be indicated. CW-based FF may be extensible for an e2e RAN path from a WTRU to the last access node in a RAN. Intermediate metrics, a packet CRC and/or a per-CW CRC may be
(Continued)

utilized for data integrity. HARQ and/or CW retransmission procedures may be implemented between network nodes for error handling.

18 Claims, 25 Drawing Sheets

(51) Int. Cl.
    *H04L 12/851*     (2013.01)
    *H04L 12/841*     (2013.01)
    *H03M 13/11*     (2006.01)
    *H04B 7/06*     (2006.01)
    *H04L 5/00*     (2006.01)
    *H04L 27/26*     (2006.01)
    *H04W 80/02*     (2009.01)
    *H04W 28/02*     (2009.01)

(52) U.S. Cl.
    CPC .......... *H04L 1/0003* (2013.01); *H04L 5/0044* (2013.01); *H04L 5/0048* (2013.01); *H04L 5/0094* (2013.01); *H04L 27/2607* (2013.01); *H04L 47/2483* (2013.01); *H04L 47/283* (2013.01); *H04L 47/34* (2013.01); *H04W 80/02* (2013.01); *H04W 28/0236* (2013.01)

(56) References Cited

U.S. PATENT DOCUMENTS

| | | | |
|---|---|---|---|
| 2003/0035371 A1 | 2/2003 | Reed et al. | |
| 2005/0105515 A1 | 5/2005 | Reed et al. | |
| 2006/0245384 A1 | 11/2006 | Talukdar et al. | |
| 2008/0098274 A1* | 4/2008 | Kwon | H04L 47/10 714/748 |
| 2008/0244352 A1* | 10/2008 | Kwon | H04L 1/1607 714/748 |
| 2009/0327443 A1* | 12/2009 | Pawar | H04L 1/1607 709/207 |
| 2010/0199159 A1* | 8/2010 | Isnardi | H03M 13/096 714/807 |
| 2011/0019776 A1 | 1/2011 | Zhang et al. | |
| 2011/0122846 A1* | 5/2011 | Yu | H04L 1/0057 370/335 |
| 2011/0206014 A1* | 8/2011 | Lee | H04L 1/1861 370/335 |
| 2013/0322244 A1 | 12/2013 | Matthews | |
| 2014/0169388 A1* | 6/2014 | Jeong | H03M 13/1191 370/474 |
| 2014/0254469 A1 | 9/2014 | Stephens et al. | |
| 2015/0089047 A1* | 3/2015 | Matthews | H04L 1/00 709/224 |
| 2016/0007371 A1 | 1/2016 | Pietraski et al. | |
| 2016/0050140 A1 | 2/2016 | Chinni et al. | |
| 2016/0316418 A1* | 10/2016 | Torab Jahromi | H04L 45/566 |
| 2019/0075526 A1* | 3/2019 | Nagaraj | H04B 7/0408 |

\* cited by examiner

LATENCY REDUCTION BY FAST FORWARD IN MULTI-HOP COMMUNICATION SYSTEMS

CROSS-REFERENCE TO RELATED APPLICATIONS

This application is the National Stage entry under 35 U.S.C. § 371 of Patent Cooperation Treaty Application PCT/US2017/040557, filed Jul. 1, 2017, which claims the benefit of U.S. Provisional Patent Application No. 62/358,436 filed on Jul. 5, 2016, the contents of which being hereby incorporated by reference as if fully set-forth herein in its respective entirety, for all purposes.

BACKGROUND

Mobile communications continue to evolve. A fifth generation may be referred to as 5G. A previous (legacy) generation of mobile communication may be, for example, fourth generation (4G) long term evolution (LTE).

SUMMARY

Devices, procedures, and instrumentalities are disclosed for latency reduction by fast forward (FF) in multi-hop communication devices and/or systems. Packets may be received and/or forwarded using a codeword (CW)-based approach (e.g. instead of a packet-based approach) with and/or without per-CW CRC. A FF session may have a flow ID and/or packets may have sequence numbers. Packets targeted for FF may be divided into independently decodable CWs that may be transmitted in the next hop, for example, as soon as the destination is determined without waiting for an entire packet's arrival and/or for CRC verification. Low latency (e.g. FF) traffic may be indicated, e.g., in headers. CW-based FF may be extensible for an end-to-end (e2e) radio-access network (RAN) path from a wireless transmit receive unit (WTRU) to the last access node in a RAN. Intermediate metrics, a packet CRC and/or a per-CW CRC may be utilized for data integrity. HARQ and/or CW retransmission procedures may be implemented between network nodes for error handling. Example devices, procedures and instrumentalities are provided, for example, for FF (e.g. using CW with and/or without per-CW CRC), error handling, control plane overlay-based route setup and/or release, low-latency joint access and/or transport and/or non-TTI operation.

A mmW base station (mB) may be in communication with a communication network. The mB may comprise a memory. The mB may comprise a receiver. The receiver may be configured to receive one or more packets. The mB may comprise a processor. The processor may be configured to determine that at least one packet of the one or more packets is indicated for fast forwarding. The processor may be configured to decompose the at least one packet into a plurality of codewords (CWs). The plurality of CWs may be independently decodable. The processor may be configured to determine a destination for the plurality of CWs. The processor may be configured to initiate a transmission of the plurality of CWs prior to a full receipt of the entire at least one packet, or a verification of a Cyclic Redundancy Check (CRC) of the at least one packet. The mB may comprise a transmitter. The transmitter may be configured to transmit the plurality of CWs toward a first node.

A mmW base station (mB) may be in communication with a communication network. The mB may comprise a memory. The mB may comprise a receiver. The receiver may be configured to receive one or more codewords (CWs) from a first node. The one or more CWs may be independently decodable. The one or more CWs might not have an individual Cyclic Redundancy Check (CRC). The mB may comprise a processor. The processor may be configured to initiate a decoding of the one or more CWs. The processor may be configured to determine that the at least one CW of the one or more CWs includes an error. The at least one CW may be a first erroneous CW of the decoded one or more CWs. The processor may be configured to record a location of the first erroneous CW relative to the other decoded one or more CWs. The processor may be configured to initiate a transmission of a null CW to a second node in lieu of the first erroneous CW. The processor may be configured to initiate a transmission of a negative acknowledgement (NACK) to the first node for the first erroneous CW. The mB may comprise a transmitter. The transmitter may be configured to transmit the null CW to the second node. The transmitter may be configured to transmit the NACK for the first erroneous CW to the first node.

BRIEF DESCRIPTION OF THE DRAWINGS

FIG. 2I illustrates an example of mUE/mWTRU analog beamforming with two PAAs and two RF processing chains.

DETAILED DESCRIPTION

A detailed description of illustrative embodiments will now be described with reference to the various Figures. Although this description provides a detailed example of possible implementations, it should be noted that the details are intended to be examples and in no way limit the scope of the application.

Figure 1A:
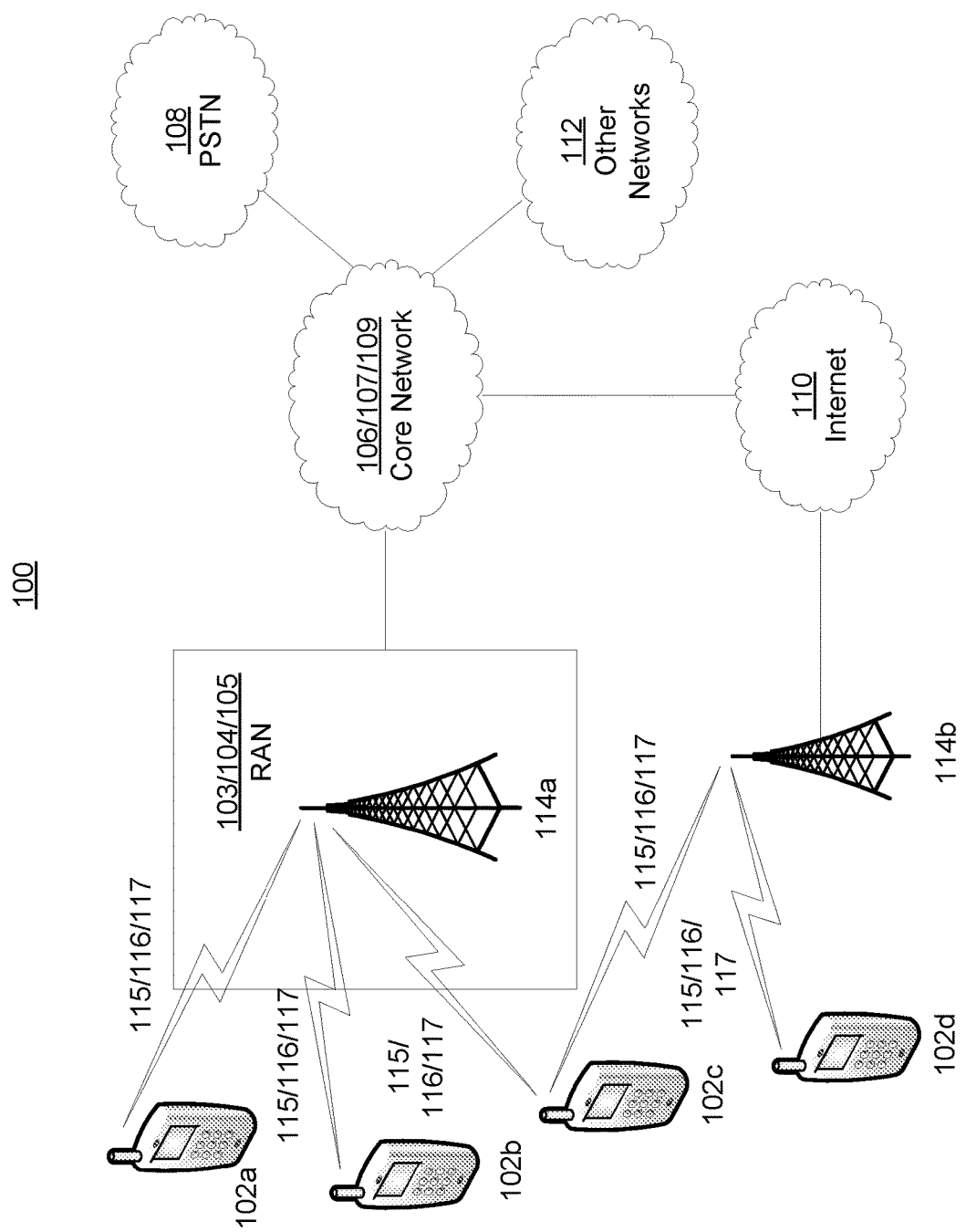
FIG. 1A is a system diagram of an example communications system in which one or more disclosed embodiments may be implemented.

FIG. 1A is a diagram of an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications system 100 may employ one or more channel access methods, such as code division multiple access (CDMA), time division multiple access (TDMA), frequency division multiple access (FDMA), orthogonal FDMA (OFDMA), single-carrier FDMA (SC-FDMA), and the like.

As shown in FIG. 1A, the communications system 100 may include wireless transmit/receive units (WTRUs), e.g., WTRUs, 102a, 102b, 102c and/or 102d (which generally or collectively may be referred to as WTRU 102), a radio access network (RAN) 103/104/105, a core network 106/107/109, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d may be configured to transmit and/or receive wireless signals and may include user equipment (UE), a mobile station, a fixed or mobile subscriber unit, a pager, a cellular telephone, a personal digital assistant (PDA), a smartphone, a laptop, a netbook, a personal computer, a wireless sensor, consumer electronics, and the like.

The communications system 100 may also include a base station 114a and a base station 114b. Each of the base stations 114a, 114b may be any type of device configured to wirelessly interface with at least one of the WTRUs 102a, 102b, 102c, 102d to facilitate access to one or more communication networks, such as the core network 106/107/109, the Internet 110, and/or the networks 112. By way of example, the base stations 114a, 114b may be a base transceiver station (BTS), a Node-B, an eNode B, a Home Node B, a Home eNode B, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 103/104/105, which may also include other base stations and/or network elements (not shown), such as a base station controller (BSC), a radio network controller (RNC), relay nodes, etc. The base station 114a and/or the base station 114b may be configured to transmit and/or receive wireless signals within a particular geographic region, which may be referred to as a cell (not shown). The cell may further be divided into cell sectors. For example, the cell associated with the base station 114a may be divided into three sectors. Thus, in some embodiments, the base station 114a may include three transceivers, e.g., one for each sector of the cell. In another embodiment, the base station 114a may employ multiple-input multiple output (MIMO) technology and, therefore, may utilize multiple transceivers for each sector of the cell.

The base stations 114a, 114b may communicate with one or more of the WTRUs 102a, 102b, 102c, 102d over an air interface 115/116/117, which may be any suitable wireless communication link (e.g., radio frequency (RF), microwave, infrared (IR), ultraviolet (UV), visible light, etc.). The air interface 115/116/117 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 103/104/105 and the WTRUs 102a, 102b, 102c may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink Packet Access (HSDPA) and/or High-Speed Uplink Packet Access (HSUPA).

In another embodiment, the base station 114a and the WTRUs 102a, 102b, 102c may implement a radio technology such as Evolved UMTS Terrestrial Radio Access (E-UTRA), which may establish the air interface 115/116/117 using Long Term Evolution (LTE) and/or LTE-Advanced (LTE-A).

In other embodiments, the base station 114a and the WTRUs 102a, 102b, 102c may implement radio technologies such as IEEE 802.16 (e.g., Worldwide Interoperability for Microwave Access (WiMAX)), CDMA2000, CDMA2000 1x, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, and the like. In some embodiments, the base station 114b and the WTRUs 102c, 102d may implement a radio technology such as IEEE 802.11 to establish a wireless local area network (WLAN). In another embodiment, the base station 114b and the WTRUs 102c, 102*d* may implement a radio technology such as IEEE 802.15 to establish a wireless personal area network (WPAN). In yet another embodiment, the base station 114*b* and the WTRUs 102*c*, 102*d* may utilize a cellular-based RAT (e.g., WCDMA, CDMA2000, GSM, LTE, LTE-A, etc.) to establish a picocell or femtocell. As shown in FIG. 1A, the base station 114*b* may have a direct connection to the Internet 110. Thus, the base station 114*b* may not be required to access the Internet 110 via the core network 106/107/109.

The RAN 103/104/105 may be in communication with the core network 106/107/109, which may be any type of network configured to provide voice, data, applications, and/or voice over internet protocol (VoIP) services to one or more of the WTRUs 102*a*, 102*b*, 102*c*, 102*d*. For example, the core network 106/107/109 may provide call control, billing services, mobile location-based services, pre-paid calling, Internet connectivity, video distribution, etc., and/or perform high-level security functions, such as user authentication. Although not shown in FIG. 1A, it will be appreciated that the RAN 103/104/105 and/or the core network 106/107/109 may be in direct or indirect communication with other RANs that employ the same RAT as the RAN 103/104/105 or a different RAT. For example, in addition to being connected to the RAN 103/104/105, which may be utilizing an E-UTRA radio technology, the core network 106/107/109 may also be in communication with another RAN (not shown) employing a GSM radio technology.

The core network 106/107/109 may also serve as a gateway for the WTRUs 102*a*, 102*b*, 102*c*, 102*d* to access the PSTN 108, the Internet 110, and/or other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and the internet protocol (IP) in the TCP/IP internet protocol suite. The networks 112 may include wired or wireless communications networks owned and/or operated by other service providers. For example, the networks 112 may include another core network connected to one or more RANs, which may employ the same RAT as the RAN 103/104/105 or a different RAT.

Some or all of the WTRUs 102*a*, 102*b*, 102*c*, 102*d* in the communications system 100 may include multi-mode capabilities, e.g., the WTRUs 102*a*, 102*b*, 102*c*, 102*d* may include multiple transceivers for communicating with different wireless networks over different wireless links. For example, the WTRU 102*c* shown in FIG. 1A may be configured to communicate with the base station 114*a*, which may employ a cellular-based radio technology, and with the base station 114*b*, which may employ an IEEE 802 radio technology.

Figure 1B:
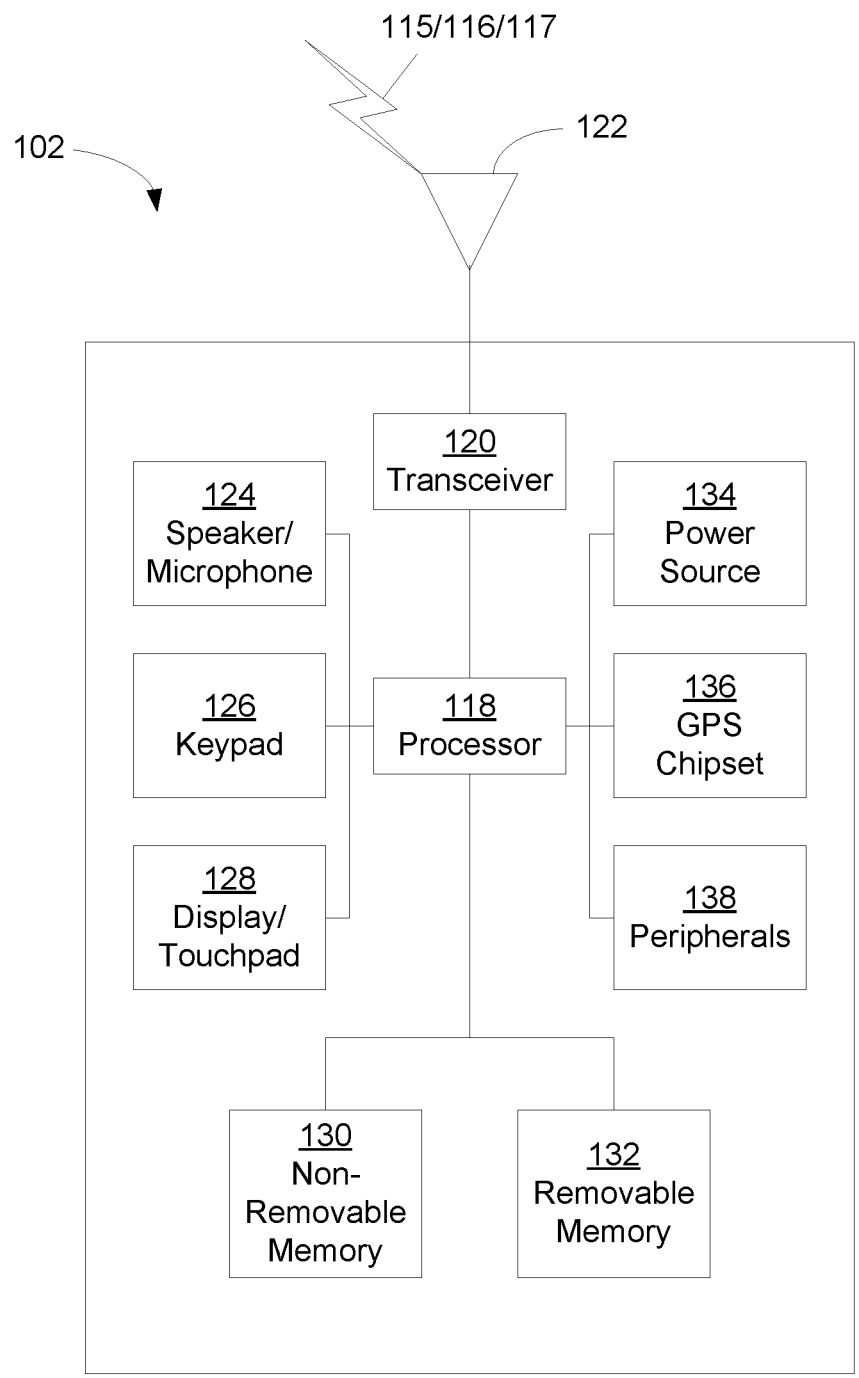
FIG. 1B is a system diagram of an example WTRU that may be used within the communications system illustrated in FIG. 1A.

FIG. 1B is a system diagram of an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and other peripherals 138. It will be appreciated that the WTRU 102 may include any subcombination of the foregoing elements while remaining consistent with an embodiment. Also, embodiments contemplate that the base stations 114*a* and 114*b*, and/or the nodes that base stations 114*a* and 114*b* may represent, such as but not limited to transceiver station (BTS), a Node-B, a site controller, an access point (AP), a home node-B, an evolved home node-B (eNodeB), a home evolved node-B (HeNB or HeNodeB), a home evolved node-B gateway, and proxy nodes, among others, may include some or all of the elements depicted in FIG. 1B and described herein.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Array (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114*a*) over the air interface 115/116/117. For example, in some embodiments, the transmit/receive element 122 may be an antenna configured to transmit and/or receive RF signals. In another embodiment, the transmit/receive element 122 may be an emitter/detector configured to transmit and/or receive IR, UV, or visible light signals, for example. In yet another embodiment, the transmit/receive element 122 may be configured to transmit and receive both RF and light signals. It will be appreciated that the transmit/receive element 122 may be configured to transmit and/or receive any combination of wireless signals.

In addition, although the transmit/receive element 122 is depicted in FIG. 1B as a single element, the WTRU 102 may include any number of transmit/receive elements 122. More specifically, the WTRU 102 may employ MIMO technology. Thus, in some embodiments, the WTRU 102 may include two or more transmit/receive elements 122 (e.g., multiple antennas) for transmitting and receiving wireless signals over the air interface 115/116/117.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as UTRA and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 115/116/117 from a base station (e.g., base stations 114a, 114b) and/or determine its location based on the timing of the signals being received from two or more nearby base stations. It will be appreciated that the WTRU 102 may acquire location information by way of any suitable location-determination implementation while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs or video), a universal serial bus (USB) port, a vibration device, a television transceiver, a hands free headset, a Bluetooth® module, a frequency modulated (FM) radio unit, a digital music player, a media player, a video game player module, an Internet browser, and the like.

Figure 1C:
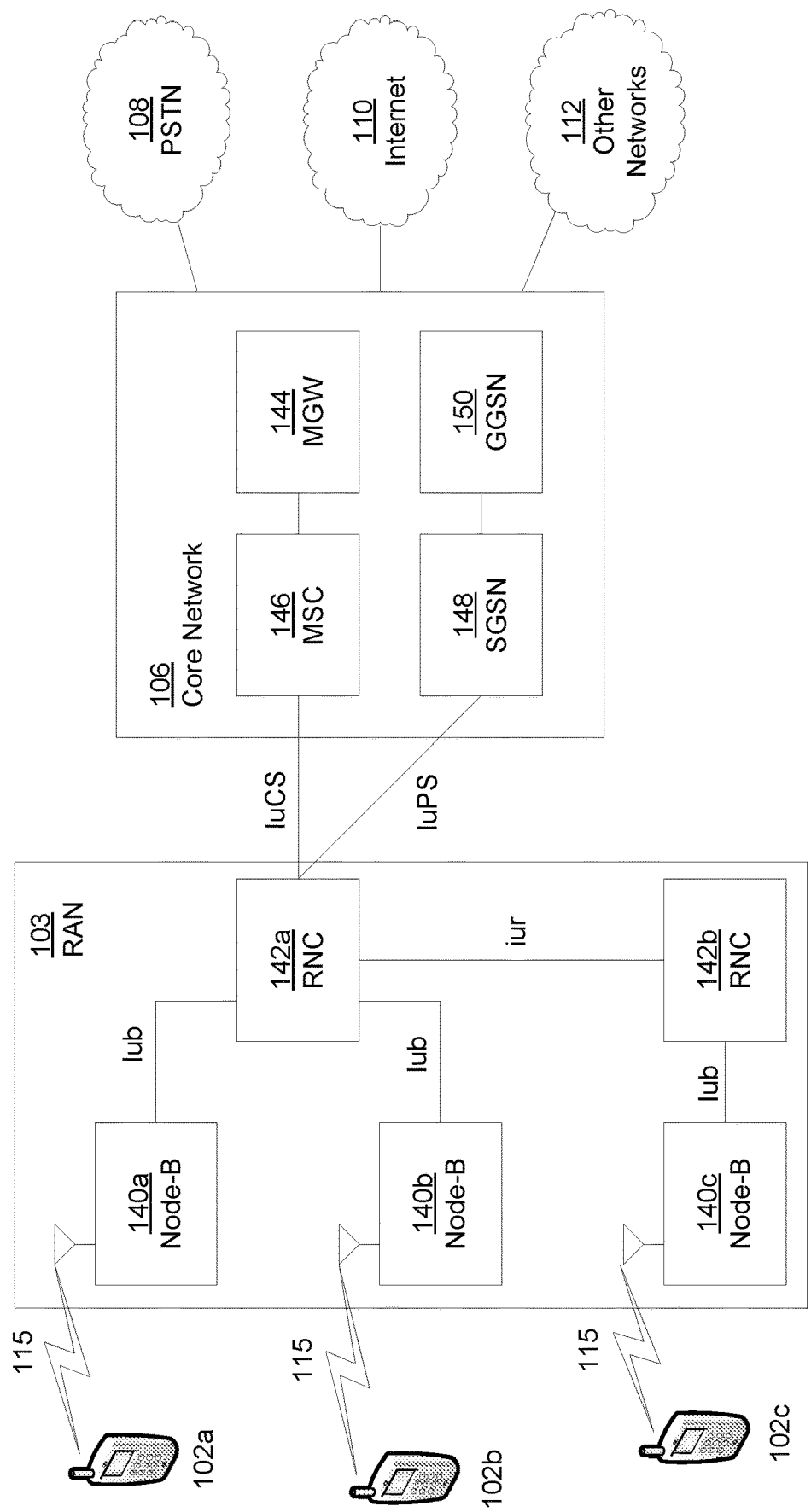
FIG. 1C is a system diagram of an example radio access network and an example core network that may be used within the communications system illustrated in FIG. 1A.

FIG. 1C is a system diagram of the RAN 103 and the core network 106 according to an embodiment. As noted above, the RAN 103 may employ a UTRA radio technology to communicate with the WTRUs 102a, 102b, 102c over the air interface 115. The RAN 103 may also be in communication with the core network 106. As shown in FIG. 1C, the RAN 103 may include Node-Bs 140a, 140b, 140c, which may each include one or more transceivers for communicating with the WTRUs 102a, 102b, 102c over the air interface 115. The Node-Bs 140a, 140b, 140c may each be associated with a particular cell (not shown) within the RAN 103. The RAN 103 may also include RNCs 142a, 142b. It will be appreciated that the RAN 103 may include any number of Node-Bs and RNCs while remaining consistent with an embodiment.

As shown in FIG. 1C, the Node-Bs 140a, 140b may be in communication with the RNC 142a. Additionally, the Node-B 140c may be in communication with the RNC 142b. The Node-Bs 140a, 140b, 140c may communicate with the respective RNCs 142a, 142b via an Iub interface. The RNCs 142a, 142b may be in communication with one another via an Iur interface. Each of the RNCs 142a, 142b may be configured to control the respective Node-Bs 140a, 140b, 140c to which it is connected. In addition, each of the RNCs 142a, 142b may be configured to carry out or support other functionality, such as outer loop power control, load control, admission control, packet scheduling, handover control, macrodiversity, security functions, data encryption, and the like.

The core network 106 shown in FIG. 1C may include a media gateway (MGW) 144, a mobile switching center (MSC) 146, a serving GPRS support node (SGSN) 148, and/or a gateway GPRS support node (GGSN) 150. While each of the foregoing elements are depicted as part of the core network 106, it will be appreciated that any one of these elements may be owned and/or operated by an entity other than the core network operator.

The RNC 142a in the RAN 103 may be connected to the MSC 146 in the core network 106 via an IuCS interface. The MSC 146 may be connected to the MGW 144. The MSC 146 and the MGW 144 may provide the WTRUs 102a, 102b, 102c with access to circuit-switched networks, such as the PSTN 108, to facilitate communications between the WTRUs 102a, 102b, 102c and traditional land-line communications devices.

The RNC 142a in the RAN 103 may also be connected to the SGSN 148 in the core network 106 via an IuPS interface. The SGSN 148 may be connected to the GGSN 150. The SGSN 148 and the GGSN 150 may provide the WTRUs 102a, 102b, 102c with access to packet-switched networks, such as the Internet 110, to facilitate communications between and the WTRUs 102a, 102b, 102c and IP-enabled devices.

As noted above, the core network 106 may also be connected to the networks 112, which may include other wired or wireless networks that are owned and/or operated by other service providers.

Figure 1D:
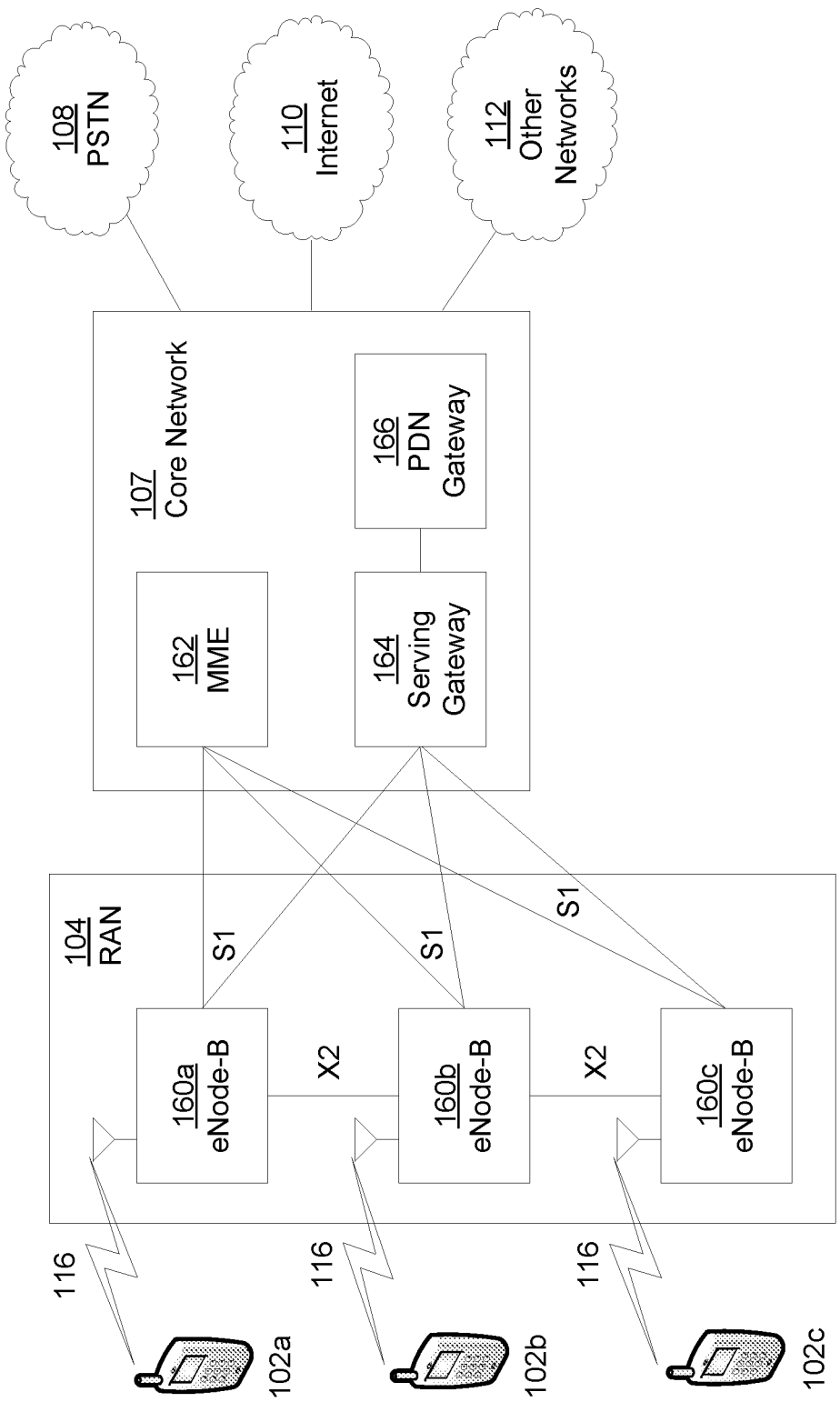
FIG. 1D is a system diagram of another example radio access network and another example core network that may be used within the communications system illustrated in FIG. 1A.

FIG. 1D is a system diagram of the RAN 104 and the core network 107 according to an embodiment. As noted above, the RAN 104 may employ an E-UTRA radio technology to communicate with the WTRUs 102a, 102b, 102c over the air interface 116. The RAN 104 may also be in communication with the core network 107.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In some embodiments, the eNode-Bs 160a, 160b, 160c may implement MIMO technology. Thus, the eNode-B 160a, for example, may use multiple antennas to transmit wireless signals to, and receive wireless signals from, the WTRU 102a.

Each of the eNode-Bs 160a, 160b, 160c may be associated with a particular cell (not shown) and may be configured to handle radio resource management decisions, handover decisions, scheduling of users in the uplink (UL) and/or downlink (DL), and the like. As shown in FIG. 1D, the eNode-Bs 160a, 160b, 160c may communicate with one another over an X2 interface.

The core network 107 shown in FIG. 1D may include a mobility management gateway (MME) 162, a serving gateway 164, and a packet data network (PDN) gateway 166. While each of the foregoing elements are depicted as part of the core network 107, it will be appreciated that any one of these elements may be owned and/or operated by an entity other than the core network operator.

The MME 162 may be connected to each of the eNode-Bs 160a, 160b, 160c in the RAN 104 via an Si interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may also provide a control plane function for switching between the RAN 104 and other RANs (not shown) that employ other radio technologies, such as GSM or WCDMA.

The serving gateway 164 may be connected to each of the eNode-Bs 160a, 160b, 160c in the RAN 104 via the Si interface. The serving gateway 164 may generally route and forward user data packets to/from the WTRUs 102a, 102b, 102c. The serving gateway 164 may also perform other functions, such as anchoring user planes during inter-eNode B handovers, triggering paging when downlink data is available for the WTRUs 102a, 102b, 102c, managing and storing contexts of the WTRUs 102a, 102b, 102c, and the like.

The serving gateway 164 may also be connected to the PDN gateway 166, which may provide the WTRUs 102a, 102b, 102c with access to packet-switched networks, such as the Internet 110, to facilitate communications between the WTRUs 102a, 102b, 102c and IP-enabled devices.

The core network 107 may facilitate communications with other networks. For example, the core network 107 may provide the WTRUs 102a, 102b, 102c with access to circuit-switched networks, such as the PSTN 108, to facilitate communications between the WTRUs 102a, 102b, 102c and traditional land-line communications devices. For example, the core network 107 may include, or may communicate with, an IP gateway (e.g., an IP multimedia subsystem (IMS) server) that serves as an interface between the core network 107 and the PSTN 108. In addition, the core network 107 may provide the WTRUs 102a, 102b, 102c with access to the networks 112, which may include other wired or wireless networks that are owned and/or operated by other service providers.

Figure 1E:
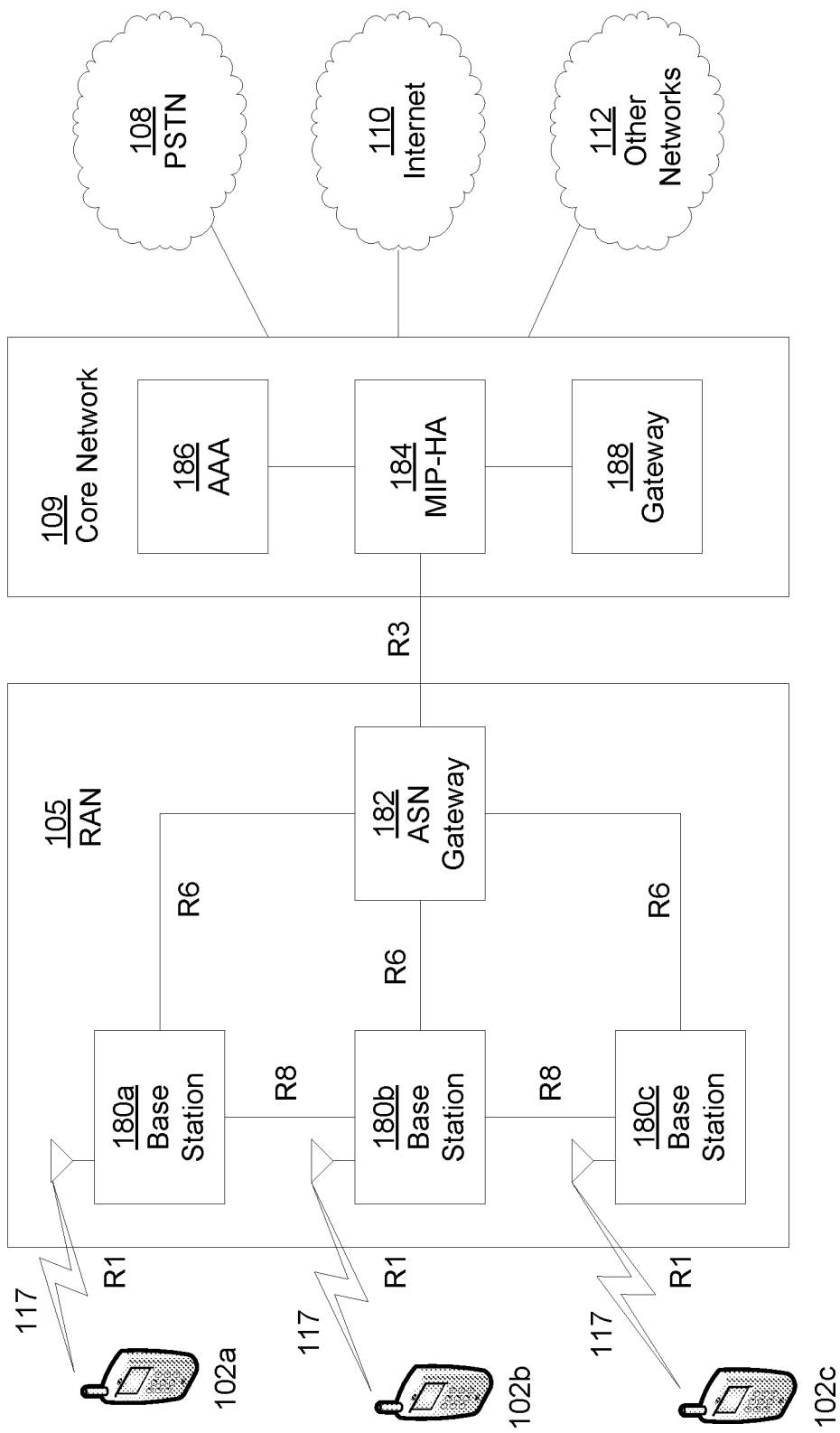
FIG. 1E is a system diagram of another example radio access network and another example core network that may be used within the communications system illustrated in FIG. 1A.

FIG. 1E is a system diagram of the RAN 105 and the core network 109 according to an embodiment. The RAN 105 may be an access service network (ASN) that employs IEEE 802.16 radio technology to communicate with the WTRUs 102a, 102b, 102c over the air interface 117. As will be further discussed below, the communication links between the different functional entities of the WTRUs 102a, 102b, 102c, the RAN 105, and the core network 109 may be defined as reference points.

As shown in FIG. 1E, the RAN 105 may include base stations 180a, 180b, 180c, and an ASN gateway 182, though it will be appreciated that the RAN 105 may include any number of base stations and ASN gateways while remaining consistent with an embodiment. The base stations 180a, 180b, 180c may each be associated with a particular cell (not shown) in the RAN 105 and may each include one or more transceivers for communicating with the WTRUs 102a, 102b, 102c over the air interface 117. In some embodiments, the base stations 180a, 180b, 180c may implement MIMO technology. Thus, the base station 180a, for example, may use multiple antennas to transmit wireless signals to, and receive wireless signals from, the WTRU 102a. The base stations 180a, 180b, 180c may also provide mobility management functions, such as handoff triggering, tunnel establishment, radio resource management, traffic classification, quality of service (QoS) policy enforcement, and the like. The ASN gateway 182 may serve as a traffic aggregation point and may be responsible for paging, caching of subscriber profiles, routing to the core network 109, and the like.

The air interface 117 between the WTRUs 102a, 102b, 102c and the RAN 105 may be defined as an R1 reference point that implements the IEEE 802.16 specification. In addition, each of the WTRUs 102a, 102b, 102c may establish a logical interface (not shown) with the core network 109. The logical interface between the WTRUs 102a, 102b, 102c and the core network 109 may be defined as an R2 reference point, which may be used for authentication, authorization, IP host configuration management, and/or mobility management.

The communication link between each of the base stations 180a, 180b, 180c may be defined as an R8 reference point that includes protocols for facilitating WTRU handovers and the transfer of data between base stations. The communication link between the base stations 180a, 180b, 180c and the ASN gateway 182 may be defined as an R6 reference point. The R6 reference point may include protocols for facilitating mobility management based on mobility events associated with each of the WTRUs 102a, 102b, 102c.

As shown in FIG. 1E, the RAN 105 may be connected to the core network 109. The communication link between the RAN 105 and the core network 109 may defined as an R3 reference point that includes protocols for facilitating data transfer and mobility management capabilities, for example. The core network 109 may include a mobile IP home agent (MIP-HA) 184, an authentication, authorization, accounting (AAA) server 186, and a gateway 188. While each of the foregoing elements are depicted as part of the core network 109, it will be appreciated that any one of these elements may be owned and/or operated by an entity other than the core network operator.

The MIP-HA may be responsible for IP address management, and may enable the WTRUs 102a, 102b, 102c to roam between different ASNs and/or different core networks. The MIP-HA 184 may provide the WTRUs 102a, 102b, 102c with access to packet-switched networks, such as the Internet 110, to facilitate communications between the WTRUs 102a, 102b, 102c and IP-enabled devices. The AAA server 186 may be responsible for user authentication and for supporting user services. The gateway 188 may facilitate interworking with other networks. For example, the gateway 188 may provide the WTRUs 102a, 102b, 102c with access to circuit-switched networks, such as the PSTN 108, to facilitate communications between the WTRUs 102a, 102b, 102c and traditional land-line communications devices. In addition, the gateway 188 may provide the WTRUs 102a, 102b, 102c with access to the networks 112, which may include other wired or wireless networks that are owned and/or operated by other service providers.

Although not shown in FIG. 1E, RAN 105 may be connected to other ASNs and the core network 109 may be connected to other core networks. The communication link between the RAN 105 the other ASNs may be defined as an R4 reference point, which may include protocols for coordinating the mobility of the WTRUs 102a, 102b, 102c between the RAN 105 and the other ASNs. The communication link between the core network 109 and the other core networks may be defined as an R5 reference, which may include protocols for facilitating interworking between home core networks and visited core networks.

In view of FIGS. 1A-1E, and the corresponding description of FIGS. 1A-1E, one or more, or all, of the functions described herein with regard to one or more of: WTRU 102a-d, Base Station 114a-b, Node B 140a-c, RNC 142a-b, MSC 146, SGSN 148, MGW 144, CGSN 150, eNode-B 160a-c, MME 162, Serving Gateway 164, PDN Gateway 166, Base Station 180a-c, ASN Gateway 182, AAA 186, MIP-HA 184, and/or Gateway 188, or the like, may be performed by one or more emulation devices (not shown) (e.g., one or more devices configured to emulate one or more, or all, of the functions described herein).

The one or more emulation devices may be configured to perform the one or more, or all, functions in one or more modalities. For example, the one or more emulation devices may perform the one or more, or all, functions while being fully or partially implemented/deployed as part of a wired and/or wireless communication network. The one or more emulation devices may perform the one or more, or all, functions while being temporarily implemented/deployed as part of a wired and/or wireless communication network. The one or more emulation devices may perform the one or more, or all, functions while not being implemented/deployed as part of a wired and/or wireless communication network (e.g., such as in a testing scenario in a testing laboratory and/or a non-deployed (e.g. testing) wired and/or wireless communication network, and/or testing performed on one or more deployed components of a wired and/or wireless communication network). The one or more emulation devices may be test equipment.

Infrastructure cost may be reduced in a millimeter Wave (mmW) based Ultra Dense Network (UDN) in a 5G system, for example, by reducing the number of fiber drops in a wireless mesh topology. A reduction in the number of fiber drops may increase the number of hops, which may increase latency.

Figure 2A:
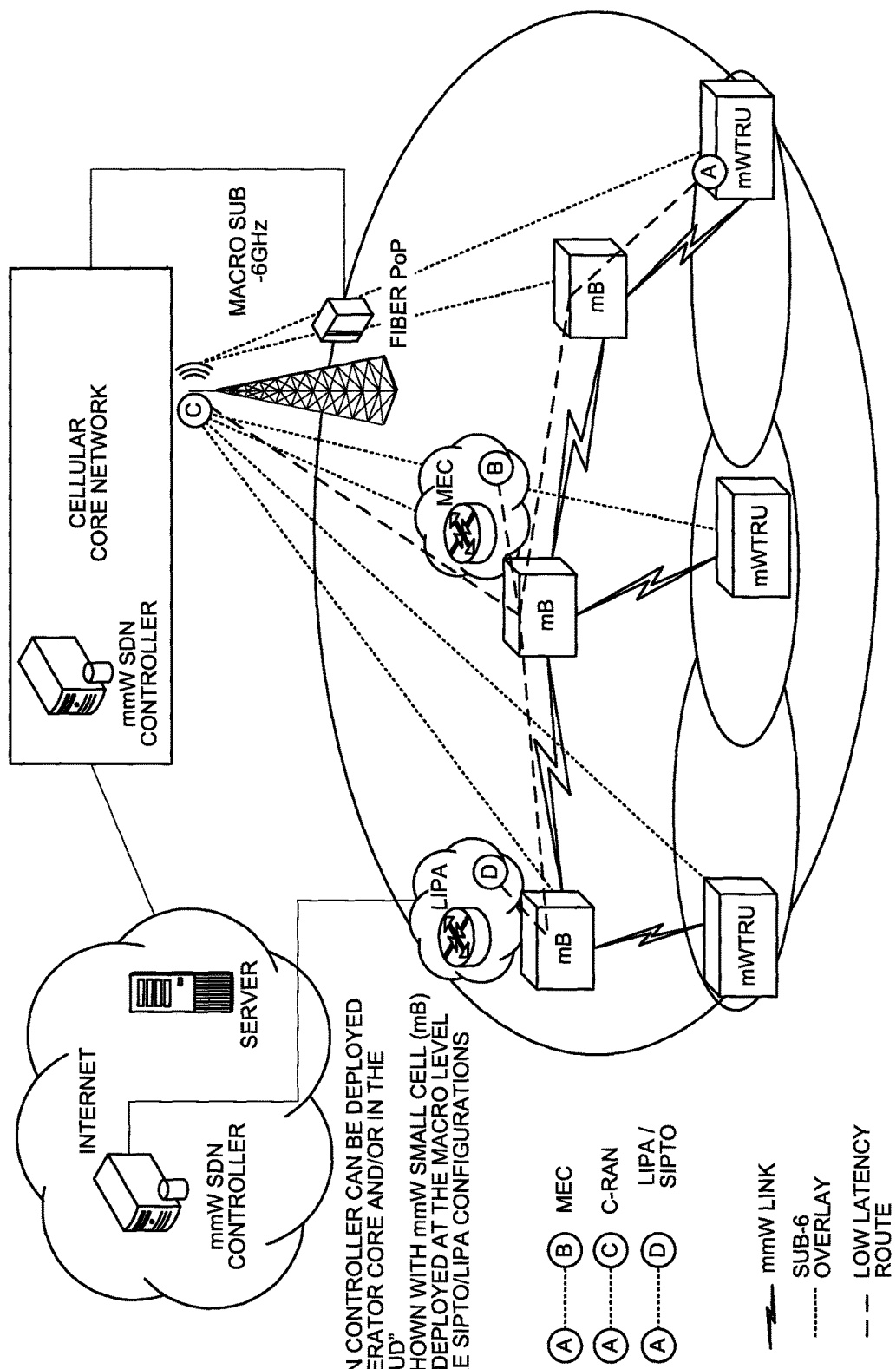
FIG. 2A illustrates an example of a network architecture for a mmW system.

FIG. 2A is an example of a network architecture for a mmW system. A mmW base station (mB) may serve a mmW UE (mUE/mWTRU) through a mmW link. User equipment (UE), such as an mUE/mWTRU, falls within the category of and/or is used interchangeably with Wireless Transmit Receive Unit (WTRU). Although the FIG. 2A examples discuss a mmW network, subject matter described herein is applicable to other networks. An mB may (e.g. also) be a small cell (SC) aggregation point for LTE and/or LTE-A traffic. An mB may be connected to another mB, for example, wirelessly through one or more mmW links. An (e.g. one or more, or each) mB may reach a gateway mB through one or more wireless hops. A gateway mB may be a network node with wired access to a core network and/or an IP cloud. Network nodes in a mmW network, e.g., mBs and/or gateway mBs, may have a sub-6 GHz connection to a macro cell. A control plane overlay may be used to provide fast and reliable control to the system.

An mmW deployment may be used, e.g., based on a 3GPP R12 small cell deployment with an extension of a LTE carrier aggregation scheme. An example is a Small Cell mmW eNB (SCmB) deployment. The SCmB may be based on the 3GPP R12 small cell deployment. The mmW operation may be performed by one or more of the following network nodes: a LTE small cell eNB may be capable of operating an mmW air interface, for example in parallel with a LTE air interface in the downlink. The SCmB may simultaneously transmit LTE downlink channels in a wide beam pattern and/or mmW channels in narrow beam pattern(s), e.g., when it is equipped with advanced antenna configuration and/or beamforming technique(s). The SCmB may support features and/or procedures in a LTE uplink operation, e.g., to support mmW wireless transmit/receive units (WTRUs) without mmW uplink transmission. A wireless transmit/receive unit (WTRU) that is capable of operating an mmW air interface, possibly in parallel with a non-mmW LTE system, may be referred to as an mmW wireless transmit/receive unit (mWTRU) and/or a an mmW user equipment (mUE/mWTRU). The terms mWTRU and mUE may be used interchangeably herein. Additionally, WTRU may be used herein to refer to an mWTRU.

For example, an mWTRU may comprise antennas (e.g., two or more sets) and/or accompanied RF chains, some operating in a LTE band and/or some for operation in an mmW frequency band. The antennas and/or accompanied RF chains may perform independent baseband processing functions, although portions of the antennas and/or RF chains may share some hardware and/or functional blocks. For example, the baseband functions may share certain hardware blocks, e.g., when the mmW air interface bears similarity with the LTE system.

In example, mmW channels may be used as an extension of a LTE carrier aggregation scheme. mmW channels may be a carrier type in the mmW frequency band. One or more mmW channels may apply a different air interface and/or legacy LTE. The mmW channels may be of opportunistic use for high-throughput and/or low-latency traffic data application(s).

LTE channels may carry control signaling, e.g., system information update, paging, RRC and/or NAS signaling (signaling radio bearers), and/or multicast traffic may be carried. LTE channels may be used to carry mmW L1 control signaling.

The SCmB and/or mUE/mWTRU may employ narrow beamforming, e.g., in NLOS at mmW frequency band, due to relatively high propagation loss associated with mmW band. Employing narrow beamforming may ensure sufficient link budget for high-throughput and/or low-latency data transmission.

Transmitting and/or receiving narrow beam pairing may be used. For example, a consistent coverage with a cell-radius of up to 200 meters may be achieved at 28 GHz and/or 38 GHz in an urban area by using a steerable 10o-beamwidth and/or a 24.5-dBi horn antenna for transmitting and/or receiving.

Figure 2B:
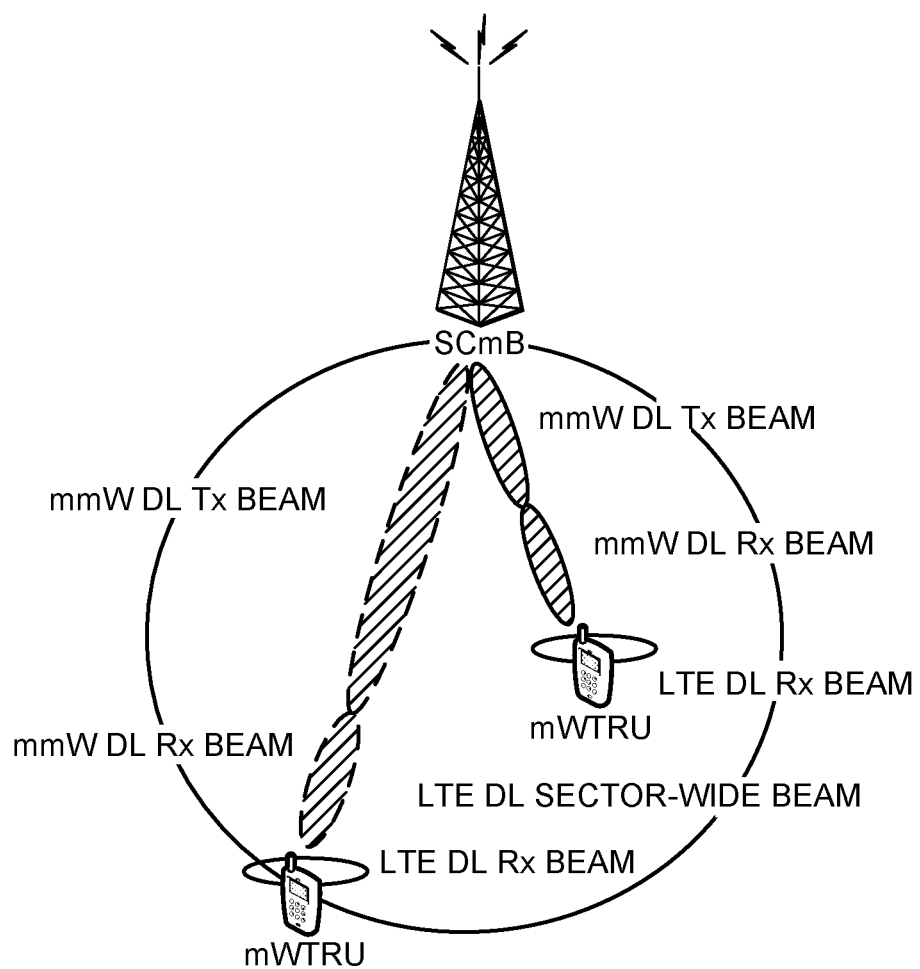
FIG. 2B illustrates an example of a mmW small cell deployment.

FIG. 2B depicts an example of a SCmB deployment. SCmB may use narrow beams for downlink transmissions. One or more mWTRUs may use receive-side narrow beams for receiving the downlink transmissions. SCmB and/or mWTRUs may apply broad beam pattern for the traditional LTE operation including cell search, random access, cell selection/reselection etc.

Figure 2C:
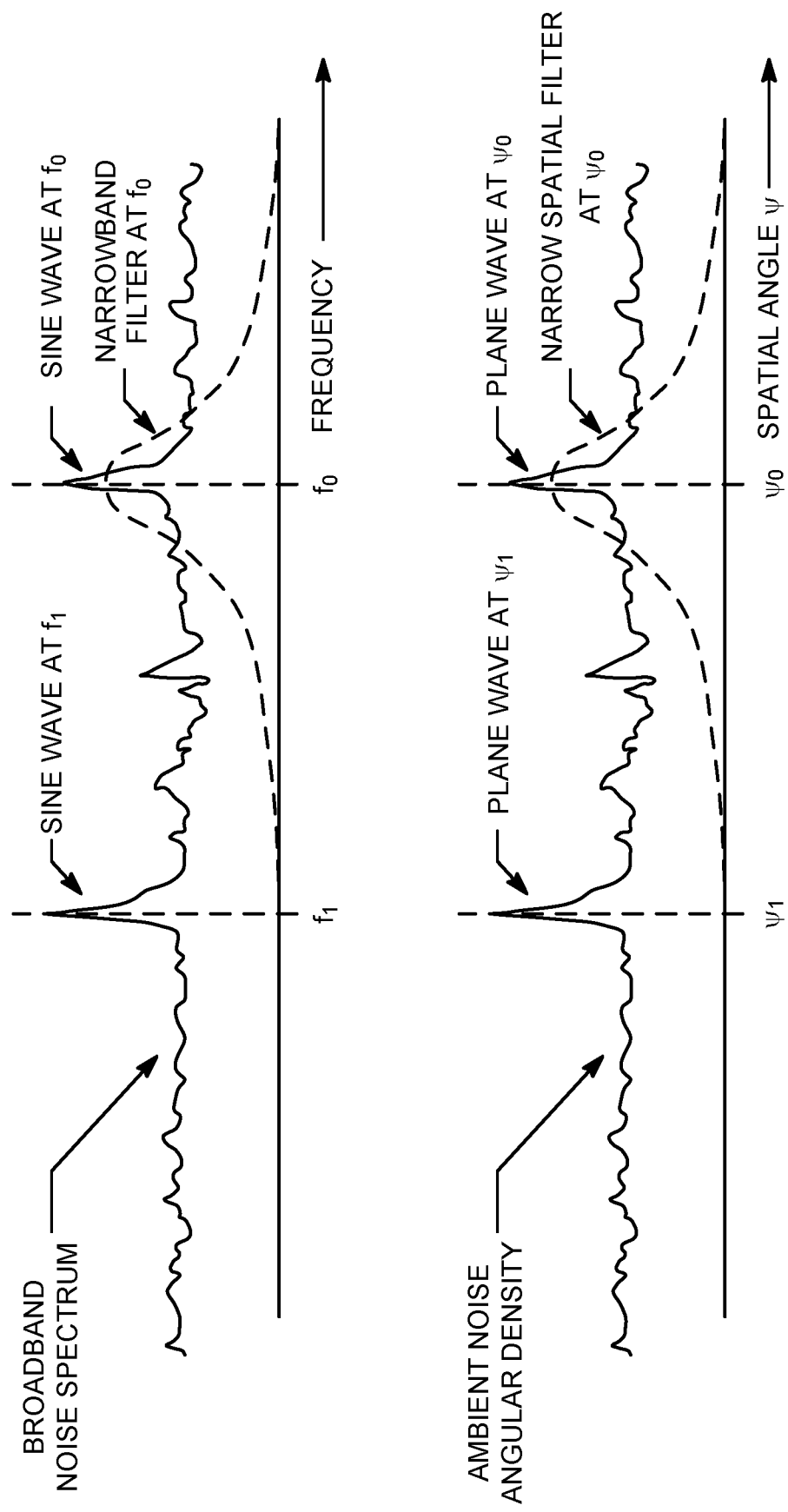
FIG. 2C illustrates an example comparison of frequency and spatial filtering.

FIG. 2C is an example of the mWTRU receive beamforming, for example, using narrow spatial filtering. FIG. 2C includes a comparison with a frequency domain filtering to demonstrate the effect of a spatial and/or angular filtering.

Similar to a frequency filtering removing unwanted frequency components, the spatial filtering may allow an mWTRU to detect a channel impulse response at a distinct angular direction captured by the narrow receive beam. This may result in a flat effective channel by excluding angular incoming paths outside of its beamwidth. A R12 LTE WTRU may be assumed to have an omni-directional receive beam pattern and/or may perceive a superimposed channel impulse response over the entire angular domain. An aligned mmW transmit and receive beam pair may provide a degree of freedom in the angular domain compared with the current LTE system.

An mmW device and/or system (e.g., a downlink device and/or system) design may focus on integrating directivity, e.g., the directivity of a narrow transmit and receive beam pair, into cellular system which may include L1 control signaling, data scheduling, narrow beam pairing, beam measurement, L1 control information feedback, etc.

The following are examples of mmW device and/or system parameters and/or assumptions. The parameters and/or assumptions may change, for example depending on the type of deployment. These parameters and/or assumptions are not intended to be limiting but serve to illustrate one possible set of parameters and/or assumptions of an example mmW device and/or system. The parameters and/or assumptions may be utilized various combinations.

For example, an example carrier frequency for mmW operation may be 28 GHz. It is an example device and/or system numerology. Similar designs may be extended to other mmW frequencies, e.g., 38 GHz, 60 GHz, 72 GHz, etc. A device and/or system bandwidth may be a variable (e.g., per carrier), for example up to a specific maximum system bandwidth. For example, 1 GHz may be used as the maximum device and/or system bandwidth with carrier aggregation being used to achieve higher overall bandwidth. An estimated RMS delay spread may be 100-200 ns with narrow beam pattern. A latency may be 1 ms. A waveform may be OFDM-based and/or broad-band-single-carrier-based. For example, dual connectivity may be based on LTE Small Cell eNB with mmW add-on channels and/or two separate antennas and/or RF chains connected to two different antenna solutions. A device and/or system design may achieve DL data rates of 30 Mbit/s for at least 95% of mWTRUs, although other design goals may be used. A mobility may be optimized data connection at 3 km/h and/or may maintain connection at 30 km/h. A coverage may meet data rate and/or mobility requirement with less than 100-m cell radius.

One or more waveforms such as broad-band Cyclic Prefixed Single Carrier (CP-SC), OFDM, SC-OFDM, MC-CDMA, Generalized OFDM, FBMC, and/or other may be used for the air interface of a device and/or system, e.g., an above-6 GHz device and/or system (e.g., cmW and/or mmW). Frame structure for the device and/or system may depend on the applied waveform. A TTI length such as 100 us may be used, e.g., to achieve low latency. A device and/or system bandwidth, e.g., one in the range of 50 MHz to 2 GHz may be used, for example to achieve high data rates.

A mmW frame structure of an OFDM-based waveform may offer flexibility in coordination between the LTE and mmW channels and/or possibly enable common functional block sharing in a mUE/mWTRU device. For example, an mmW sampling frequency may be selected as an integer multiple of the LTE minimum sampling frequency of 1.92 MHz, which may lead to an mmW OFDM sub-carrier spacing $\Delta f$ being an integer multiple of the LTE sub-carrier spacing of 15 kHz, e.g. $\Delta f=15*K$ kHz. The selection of the integer multiple K and/or the resulting $\Delta f$ may take into consideration the sensitivity to the Doppler shift, different types of frequency errors and/or the ability to remove channel time dispersion. The orthogonality between sub-carriers may deteriorate and/or inter-sub-carrier interference USD may increase when the Doppler shift increases in proportion to the sub-carrier spacing.

For example, the maximum Doppler shift at 30 km/h and 28 GHz may be approximately 778 Hz. Example 28-GHz channel time dispersion measurements in dense urban area may indicate an RMS delay spread $\sigma$ that may be between $\frac{1}{50}\sigma$ and 200 ns for up to 200-m cell radius. The 90% coherence bandwidth may be estimated at $\frac{1}{50}\sigma$ of 100 kHz and the 50% coherence bandwidth at $\frac{1}{5}\sigma$ of 1 MHz.

A sub-carrier spacing $\Delta f$ between 100 kHz and 1 MHz may thus be reasonable. A sub-carrier spacing of 300 kHz (K=20) may be robust against Doppler shift and/or other types of frequency error and/or reduce implementation complexity. The corresponding symbol length ($1/\Delta f$) could be approximately 3.33 us.

A cyclic prefix (CP) length is normally configured to span over the entire length of the channel time dispersion in order to eliminate the inter-symbol-interference. As a CP does not carry useful data, a long CP may cause excessive device and/or system overhead. One example of CP length for a Tsymbol of 3.33 us may be selected at $\frac{1}{14}$ of Tsymbol, 0.24 us and the corresponding CP overhead is 7% as calculated by TCP/(TCP+Tsymbol).

In order to achieve low latency, the TTI length of the mmW transmission may be reduced compared to the 1-ms TTI length of the LTE system. In some scenarios, it may be useful to have an mmW sub-frame length of 1 ms to align with the LTE 1-ms sub-frame timing. The mmW sub-frame may contain one or more, or multiple, mmW TTIs whose length may be tied to other parameters such as sub-carrier spacing, symbol length, CP length, and/or FFT size, etc.

Based on these and other considerations, an example with a conservative CP length (4× channel delay spread) is summarized in Table 1. The CP length selection may be based on the assumption that the delay spread over potential mmW frequency band is lower than 200 ns.

TABLE 1

Example mmW Downlink OFDM Numerology

| OFDM Numerology Parameters | | | | |
|---|---|---|---|---|
| Device and/or system bandwidth (MHz) | 125 | 250 | 500 | 1000 |
| Sampling rate (MHz) | 153.6 | 307.2 | 614.4 | 1228.8 |
| Sub-carrier spacing (kHz) | 300 | 300 | 300 | 300 |
| Number of sub-carrier per RB | 12 | 12 | 12 | 12 |
| RB bandwidth (MHz) | 3.6 | 3.6 | 3.6 | 3.6 |
| Number of assignable RBs | 32 | 64 | 128 | 256 |
| Number of occupied sub-carriers | 384 | 768 | 1536 | 3072 |
| Occupied bandwidth (MHz) | 115.2 | 230.4 | 460.8 | 921.6 |
| IDFT(Tx)/DFT(Rx) size | 512 | 1024 | 2048 | 4096 |
| OFDM symbol duration (us) | 3.333 | 3.333 | 3.333 | 3.333 |
| CP length (ratio to symbol length) | 1/4 | 1/4 | 1/4 | 1/4 |
| CP length (us) | 0.833 | 0.833 | 0.833 | 0.833 |
| Number of symbols per slot | 24 | 24 | 24 | 24 |
| Slot duration (TTI) (us) | 100 | 100 | 100 | 100 |
| Sub-frame duration (ms) | 1 | 1 | 1 | 1 |
| Number of slots per sub-frame | 10 | 10 | 10 | 10 |
| Frame duration (ms) | 10 | 10 | 10 | 10 |
| Number of sub-frames per frame | 10 | 10 | 10 | 10 |
| Number of symbols per TTI per RB | 288 | 288 | 288 | 288 |
| Number of symbols per TTI using all RBs | 9216 | 18432 | 36864 | 73728 |
| Signaling overhead | 20% | 20% | 20% | 20% |
| Data rate using uncoded 64QAM (Mbps) | 442.368 | 884.736 | 1769.472 | 3538.944 |
| Spectral efficiency | 3.538944 | 3.538944 | 3.538944 | 3.538944 |

Figure 2D:
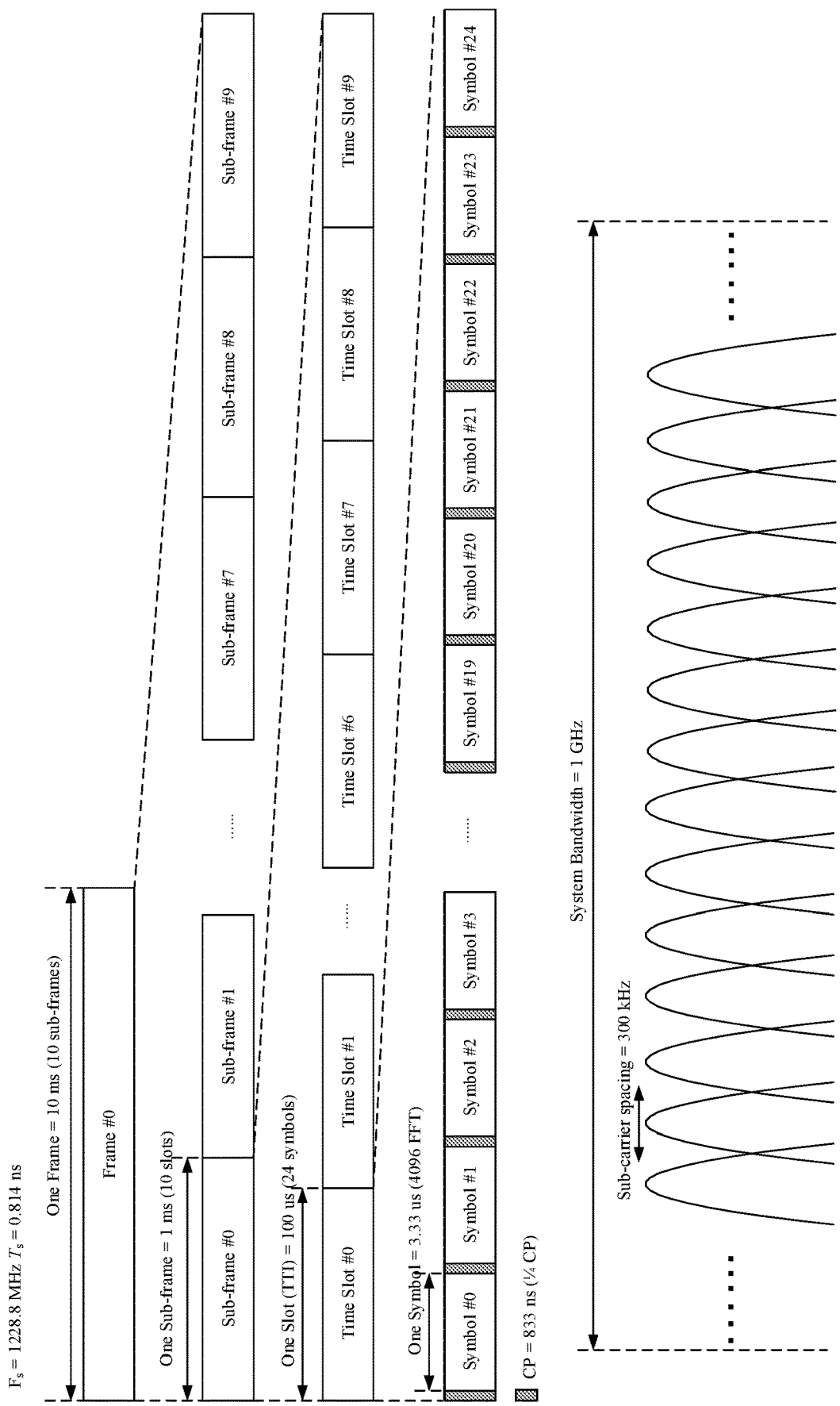
FIG. 2D illustrates an example of an OFDM frame structure.

FIG. 2D depicts an example OFDM-based frame structure. For example, the device and/or system bandwidth may be 1 GHz and/or a sub-carrier spacing of 300 kHz may be used with a corresponding symbol length of 3.33 us. An example cyclic prefix (CP) length of ¼ of Tsymbol which equals 0.833 us may be used.

Some of the frame structure examples presented herein may be based on an assumption that an OFDM-based mmW waveform, which may be incorporated into the OFDM-based LTE small cell network, is utilized. The techniques and procedures described herein may be equally applicable to numerous types of frame designs and should not be interpreted to be bound by this specific frame structure and may be applied to other waveform candidates.

The SCmB and/or mUE/mWTRU deployments may employ one or more of the following mmW physical layer channels and/or reference signals, for example rather than and/or in addition to the existing LTE physical channels.

An SCmB and/or an mUE/mWTRU may employ a unique sequence transmitted per transmit beam, e.g., a Beam-Specific Reference Signal (BSRS), used for beam acquisition, timing/frequency synchronization, channel estimation for a Physical Downlink Directional Control Channel (PDDCCH), beam tracking and/or measurement, etc. The BSRS may carry implicitly beam identity information including BSRS sequence index. There may be different types of BSRSs. The BSRS resource allocation may be pre-defined.

An SCmB and/or an mUE/mWTRU may employ a unique sequence scheduled and/or transmitted dynamically for the purpose of beam pair measurement specific for a given antenna port, e.g., an Adaptive Antenna Reference Signal (AARS). The AARS may embed (e.g., implicitly) the beam identity information in the sequence index and/or carry a small payload including the same information.

An SCmB and/or an mWTRU may utilize a Physical Downlink Directional Control Channel (PDDCCH). The PDDCCH may carry data related control information for an mWTRU to identify, demodulate and/or decode an associated Physical Downlink Directional Data Channel (PDDDCH) correctly. The PDDCCH may be carried in an mmW narrow beam and/or in a broad beam and/or may be applied for different multiple access. For example, there may be a common PDDCCH transmitted in downlink mmW broad beam covering a sector and/or cell and/or a dedicated PDDCCH transmitted in a narrow beam pair, for example when mWTRU-specific data transmission is on-going. The dedicated PDDCCH may carry scheduling information for its associated PDDDCH on a per-TTI basis and/or may or might not carry beam specific information. A common PDDCCH may include cell-specific information including sector/segment identity and/or beam identity. In addition, an mUE/mWTRU may read the common PDDCCH to determine if it is scheduled for narrow beam pairing procedure in order to begin narrow beam data transmission subsequently.

An SCmB and/or an mWTRU may utilize a Physical Downlink Directional Data Channel (PDDDCH). The PDDDCH may carry payload information received in the form of MAC PDU from mmW MAC layer. The resource allocation of this channel may be determined by the downlink scheduling information carried in PDDCCH. The PDDDCH intended for a mUE/mWTRU may be transmitted in a narrow Tx beam and/or received in a properly paired narrow Rx beam, e.g. a narrow beam pair. Due to this spatial isolation, PDDDCHs for different WTRUs in different beam pairs may reuse a combination of one or more time, frequency, and/or code resource(s). One or more, or multiple PDDDCH may also operate in one beam pair using multiple access in one or more of the time, frequency and/or code domain. A common PDDDCH may be used to carry data in broad mmW antenna pattern associated with the common PDDCCH.

An SCmB and/or an mWTRU may utilize symbols embedded in a transmission for channel estimation for PDDDCH, e.g., a Demodulation Reference Signal (DMRS). For example, the DMRS may be placed in the time and/or frequency domain according to pre-defined pattern, perhaps to ensure correct interpolation and/or reconstruction of the channel.

Figure 2E:
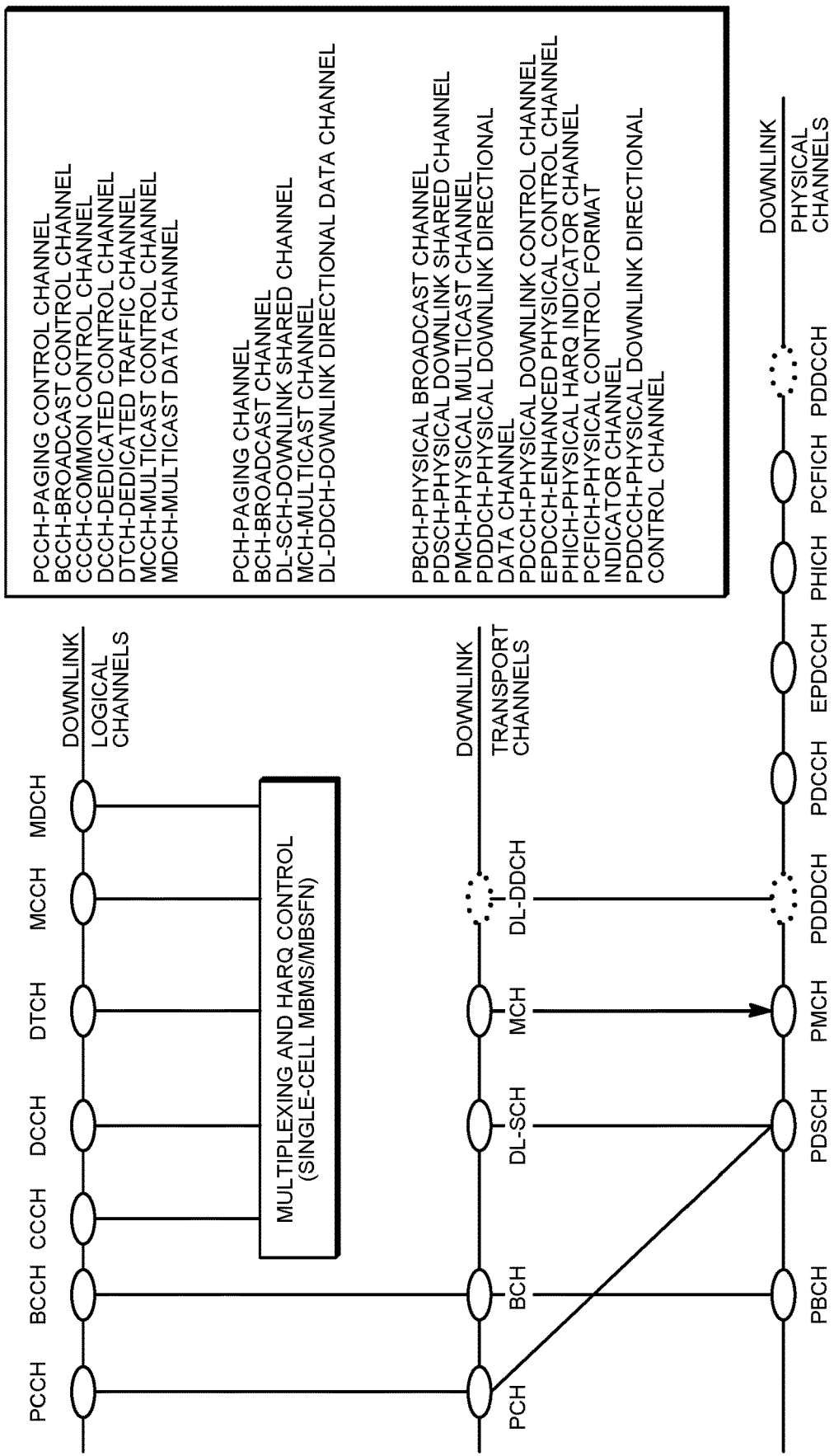
FIG. 2E illustrates an example mmW downlink logical, transport, and physical channel architecture.

Some or all channels and/or reference signals in a narrow beam pair may be beamformed identically and/or considered to be transmitted via a specific and/or a (e.g., single) physical antenna port. Although carrying broadcast and/or multicast information on a narrow beam can be utilized, given the directivity of the transmission of these channels, carrying broadcast, multicast, and/or other cell-specific information on the narrow beam might not be an optimal application. The SCmB deployment with mmW downlink data transmission may adopt a channel mapping as illustrated in FIG. 2E, where the mmW channels are indicated via dotted lines.

An mUE/mWTRU may use a phase antenna array to achieve the beamforming gain, for example in order to compensate the high path loss at mmW frequencies. At the mmW frequencies the short wavelength may allow a compact form factor of the device design. A large spacing such as $0.7\lambda$ may be applied. An element spacing of $0.5\lambda$ may be used in theoretical performance analysis.

Figure 2F:
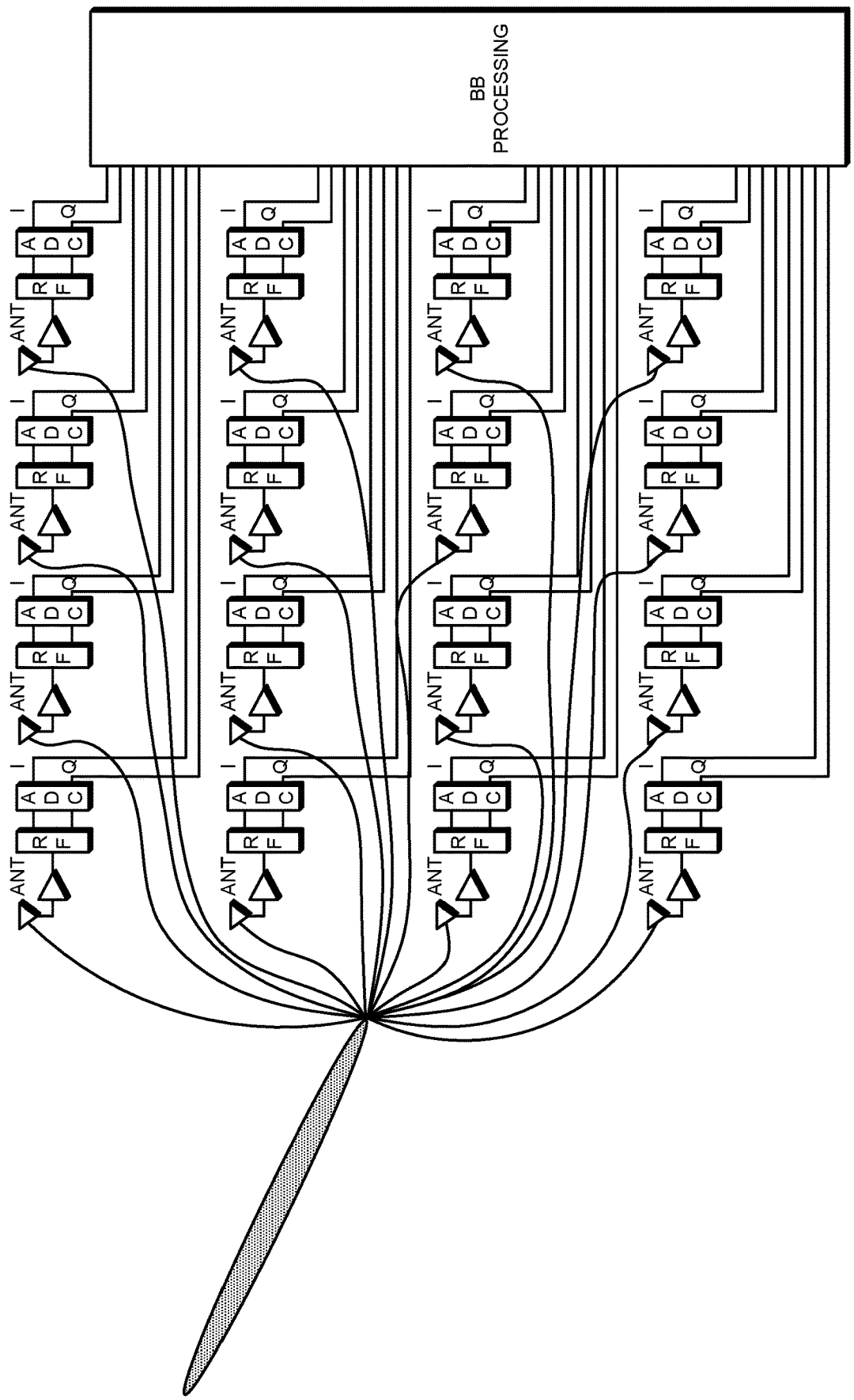
FIG. 2F illustrates an example of mUE/mWTRU fully digitized beamforming.

The phase antenna may apply one or more different beamforming methods. For example, a fully digitized beamforming approach may have a dedicated RF chain. For example, the RF chain may include RF processing and/or ADC as depicted in FIG. 2F for an antenna element. The signal processed by an antenna element may be controlled independently in phase and/or amplitude to optimize the channel capacity.

The configuration may have the same number of RF chains and/or ADCs as that of antenna elements. The mUE/mWTRU antenna may offer very high performance. The mUE/mWTRU antenna configuration may impose costs and/or complexity in implementation. The mUE/mWTRU antenna configuration may cause high energy consumption in operation. Fully digitized beamforming might not be adopted in the initial 5G deployments and/or mUE/mWTRU implementations, but may be used in future releases.

Figure 2G:
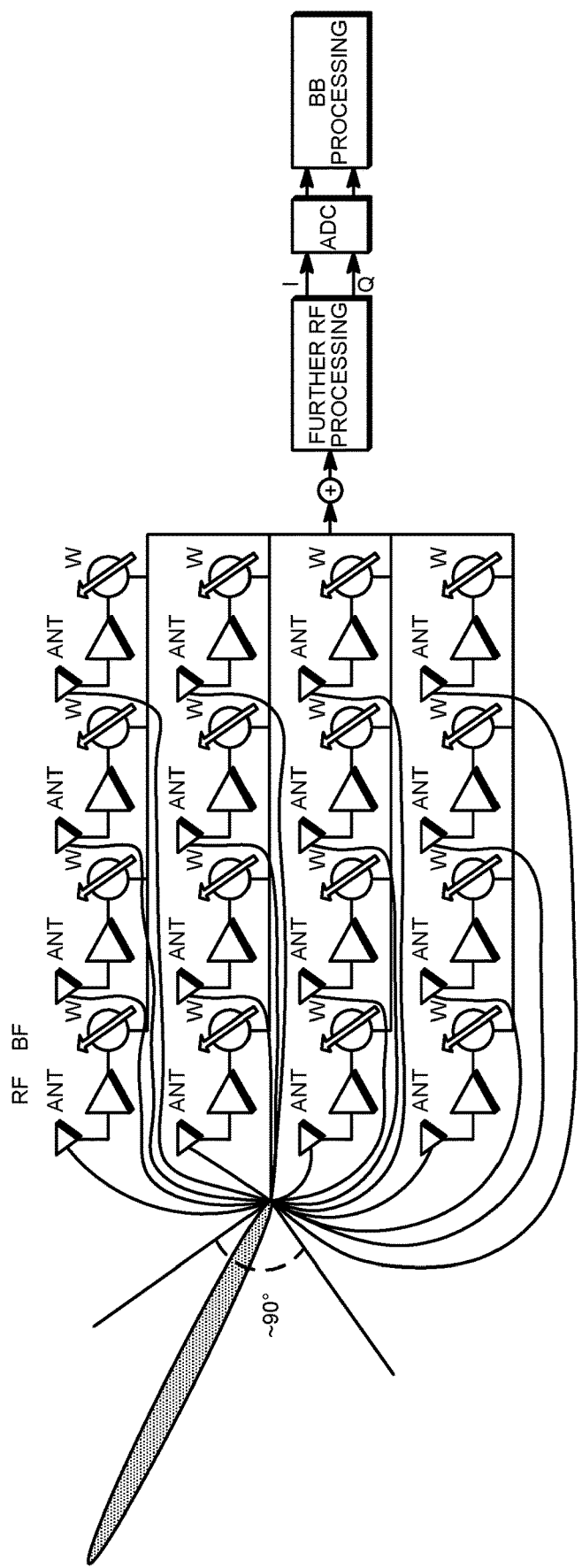
FIG. 2G illustrates an example of mUE/mWTRU analog beamforming with one phase array antenna (PAA) one RF processing chain.

FIG. 2G may be an example of analogue beamforming. In analog beamforming, one RF chain may be applied for a given phase antenna array (PAA). For example, an antenna element may be connected to a phase shifter. The phase shifter may be used to set the weight for beam forming and/or steering. The number of RF chains may be significantly reduced using analog beamforming (e.g., as compared to digital beamforming). The energy consumption may be significantly reduced.

The phase of the signal at an antenna element may be adjusted in the beamforming. FIG. 2G shows that the phase shifting and combining may be implemented in different stages, e.g., in RF, BB analogue, and/or LO. One or more of the following may be used to evaluate the effectiveness/efficiency of an approach, e.g., signal loss, phase error, power consumption, etc.

The mUE/mWTRU analogue beamforming methods may comprise one or more of the following. The mUE/mWTRU analogue beamforming algorithms may comprise a grid of beams having a set of fixed beams, e.g., a fixed codebook-based beamforming. A beam may be formed by the mUE/mWTRU applying a beamforming weight vector v chosen from a pre-defined codebook $v \in \{v_1, v_2, v_3 \ldots V_N\}$, where N denotes the number of fixed beams. A vector may comprise pre-calibrated phase shifts for one or more, or all, phase shifters and/or may represent a unique analogue beam direction, e.g., "beam". The number of beams may depend on the Half-Power-Beam-Width (HPBW) of the beamforming and/or desired coverage. The mUE/mWTRU analogue beamforming algorithms may comprise a continuous phase shifting beamforming. For example, the desired weight of a phase shifter may be calculated based on the estimated short-term channel information and converted using a high resolution digital-to-analogue converter (DAC) for the phase shifter. The continuous phase shifting beamforming may provide a continuous and/or adaptive beamforming to track the channel conditions. The algorithm may perform well in scenarios, e.g., with increased multipath, high angular spread, and/or low UE mobility.

An mUE/mWTRU may employ a hybrid approach comprising the digitized and/or analogue beamforming. For example, the analogue beamforming may be performed over the phase array antenna elements where an antenna element is associated with a phase shifter and/or connected to one RF chain. The digitized beamforming may comprise a digital precoding applied on the baseband signal of a RF chain, e.g., when there is more than one RF chain. MIMO schemes may be implemented using digital precoding.

Examples for the (e.g., basic) device and/or system parameters of the hybrid beamforming may include one or more of a Number of data stream, NDATA; Number of RF chain (TRX), NTRX; Number of antenna ports, NAP; Number of antenna elements, NAE; and/or Number of phase antenna array, NPAA.

The configuration of these parameters may impact on the device and/or system function and/or performance.

When $N_{PAA} \leq N_{AP} \leq N_{TRX} \leq N_{AE}$, one or more of the following may occur. A PAA may comprise one or more, or multiple, antenna elements, e.g., a PAA of size 4×4 has 16 antenna elements. An antenna port may be defined, and/or the channel over which a symbol on the antenna port is conveyed may be inferred from the channel over which another symbol on the same antenna port is conveyed. There may be one resource grid per antenna port. Cell-specific reference signals may support a configuration of one, two, and/or four antenna ports and/or may be transmitted on antenna ports p=0, p∈{0, 1} and/or p∈{0, 1, 2, 3}, perhaps respectively. MBSFN reference signals may be transmitted on antenna port p=4. WTRU-specific reference signals associated with PDSCH may be transmitted on antenna port(s) p=5, p=7, p=8, and/or one or several of p∈{7, 8, 9, 10, 11, 12, 13, 14}. Demodulation reference signals associated with EPDCCH may be transmitted on one or several of p∈{107, 108, 109, 110}. Positioning reference signals may be transmitted on antenna port p=6. CSI reference signals may support a configuration of one, two, four and/or eight antenna ports and/or may be transmitted on antenna ports p=15, p∈{15, 16}, p∈{15, 16, 17, 18}, and/or p∈{15, 16, 17, 18, 19, 20, 21, 22}, perhaps respectively.

Figure 2H:
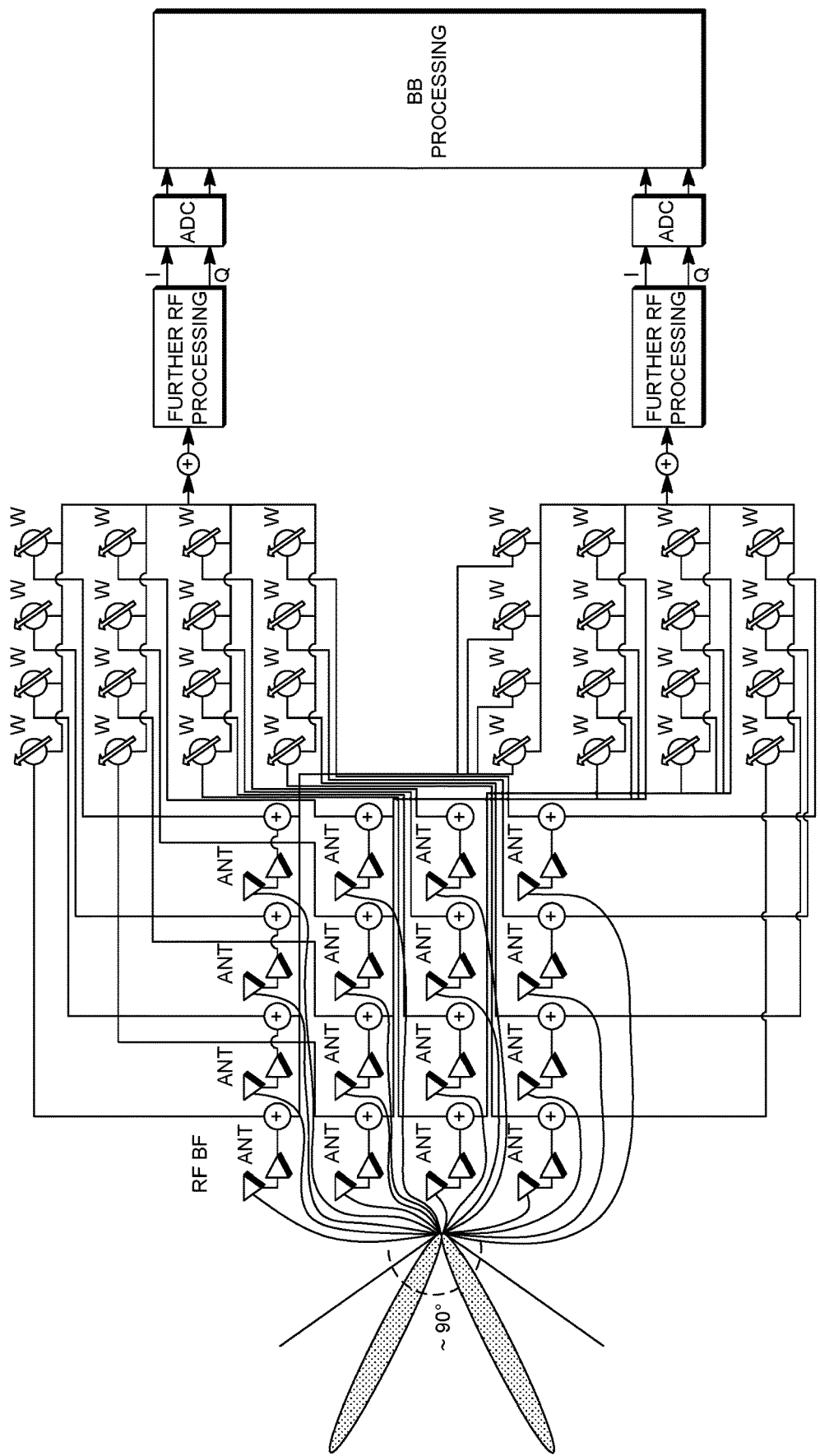
FIG. 2H illustrates an example of mUE/mWTRU analog beamforming with one PAA and two RF processing chains.
Figure 21:
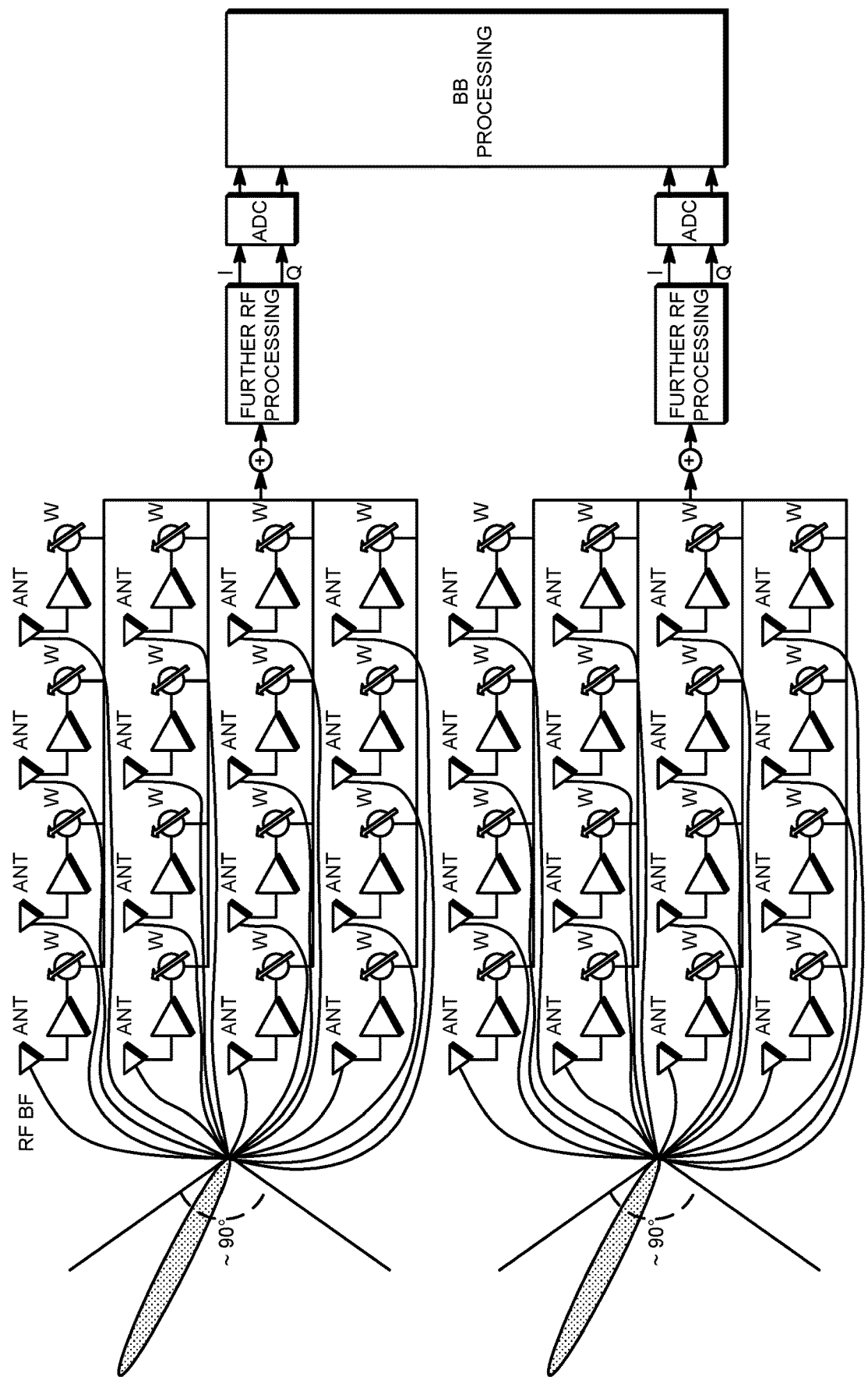

An antenna port may carry beamformed reference signal(s) that may be uniquely associated with this antenna port and/or that can be used to identify the antenna port. The antenna configuration may become fully digitized as shown in FIG. 2F, e.g., when the number of TRX equals the number of antenna elements. An example may be one RF chain per antenna element. A PAA may be connected to a RF chain (as shown in FIG. 2G) and/or one or more, or multiple, RF chains, e.g., depending on the device and/or system configuration. In FIG. 2H, $N_{PAA} < N_{AP} = N_{TRX} < N_{AE}$, one PAA of size 4×4 is connected to two RF chains and (e.g., one or more, or each) of the one or more RF chain has a set of 16 phase shifters. The PAA may form two narrow beam patterns within a +45° and −45° coverage in azimuth plane. FIG. 2I is an example of two PAAs and a (e.g., one or more, or each) PAA may have a dedicated RF chain, e.g., $N_{PAA} = N_{AP} = N_{TRX} \leq N_{AE}$. The example in FIG. 2I may allow a spatial independence between the two simultaneous beams by placing the PAAs at different orientation e.g. in azimuth plane. An aligned PAA arrangement may provide an aggregated larger coverage compared to the configuration in FIG. 2H. One or more configurations with two RF chains may apply MIMO with two data streams.

Figure 2J:
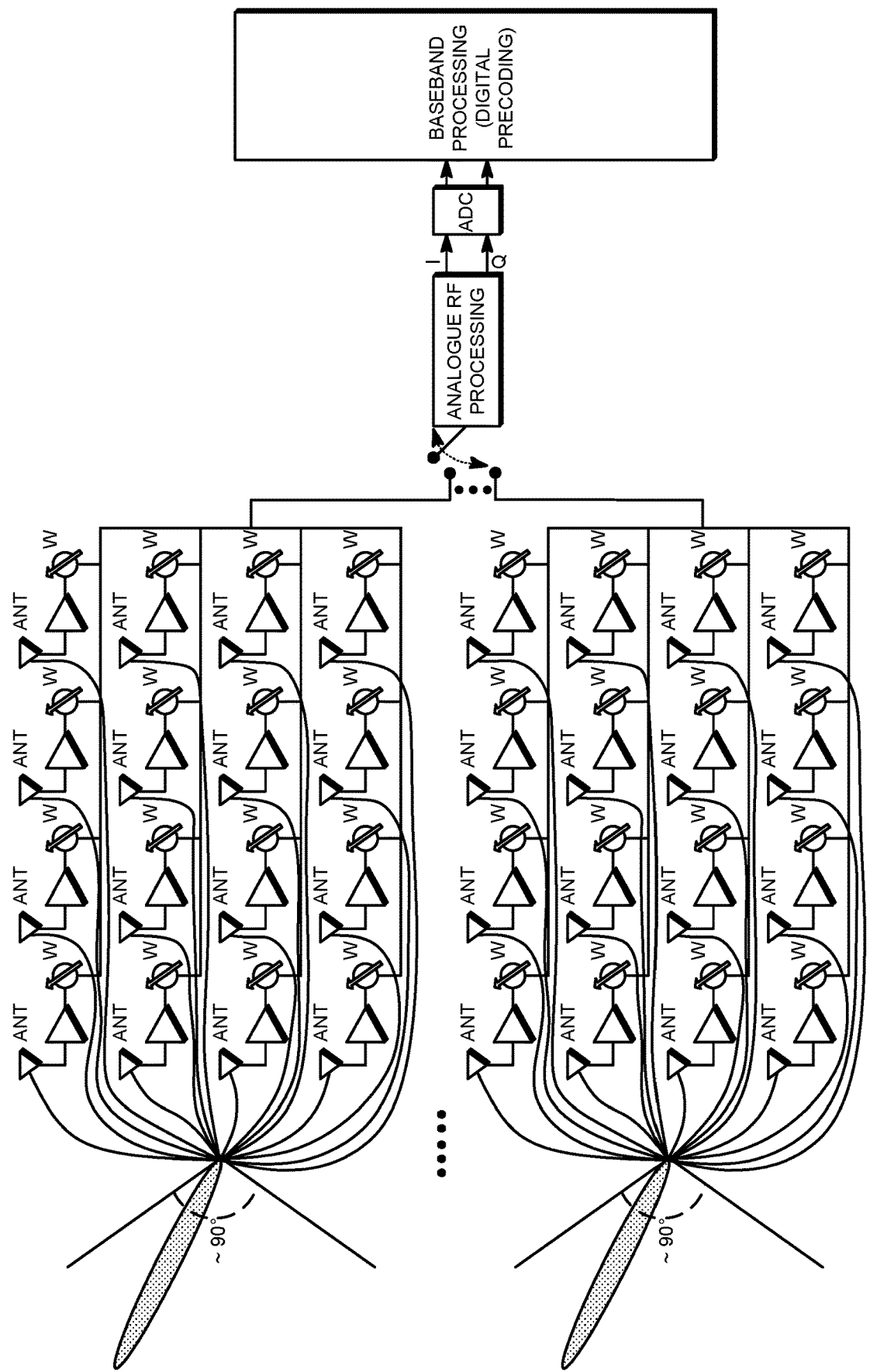
FIG. 2J illustrates an example of mUE/mWTRU analog beamforming with two PAAs and one RF processing chain.

When $N_{AE} > N_{PAA} > N_{AP} = N_{TRX}$ one or more, or multiple, PAAs may be connected to a (e.g., single) RF chain by using a switch as depicted in FIG. 2J. A PAA may form a narrow beam pattern covering from +45° to −45° in azimuth plane. They may be oriented separately. A single-beam solution may provide a good coverage by using a narrow beam at different direction at different time instances.

When $N_{DATA} \leq N_{TRX} \leq N_{AE}$, the following may occur.

Figure 2K:
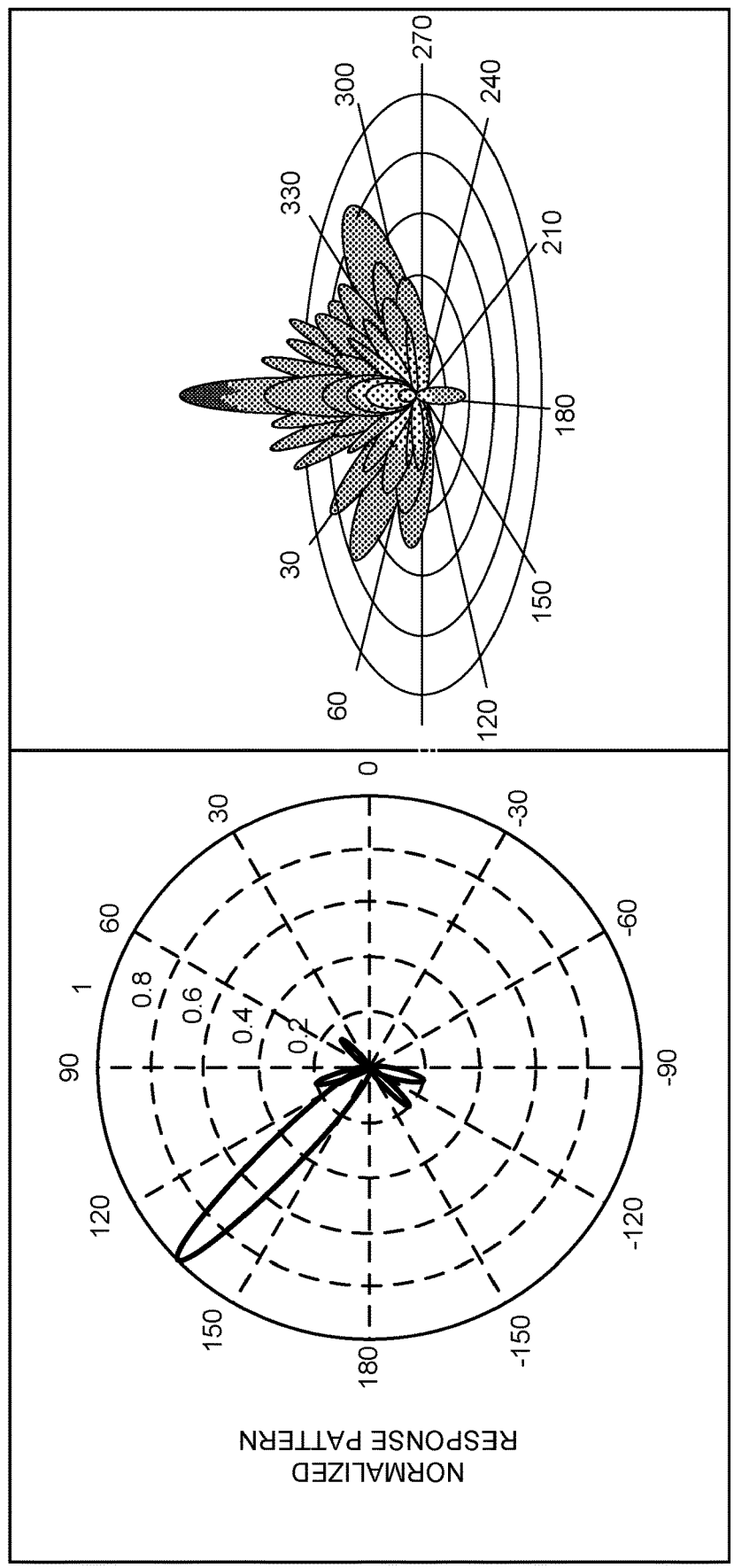
FIG. 2K illustrates an example of illustrative 2D and realistic 3D narrow beam pattern.
Figure 2L:
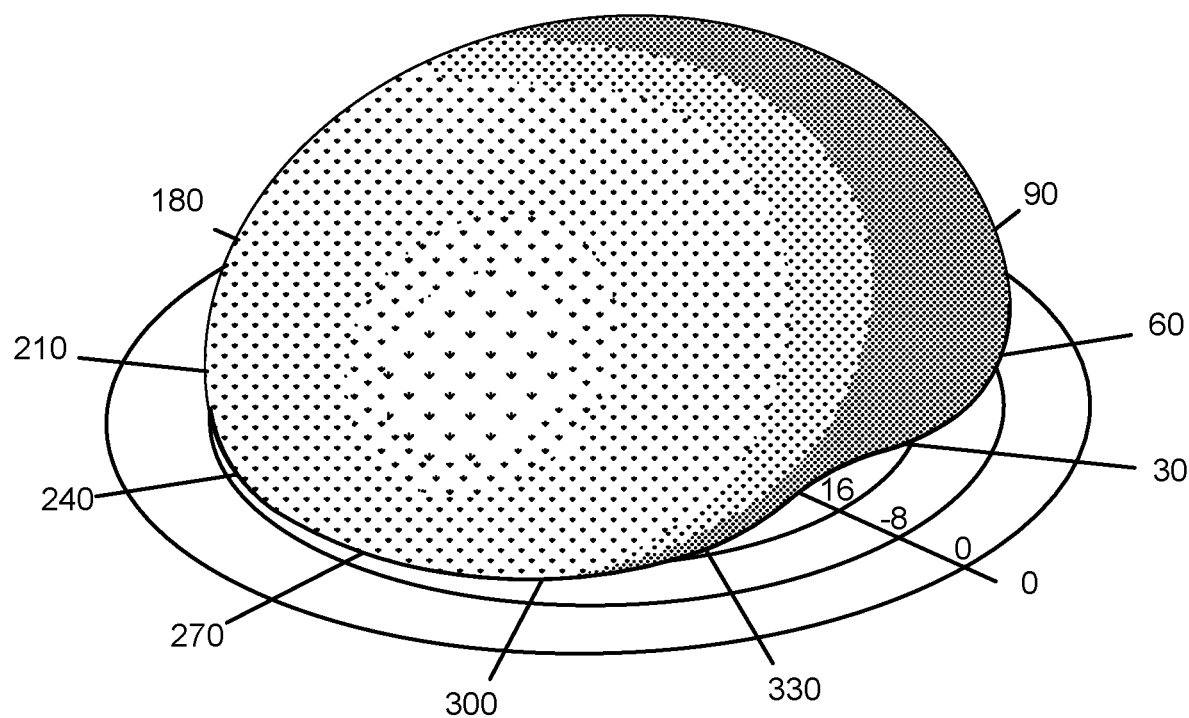
FIG. 2L illustrates an example of a realistic 3D broadside broad beam pattern.

When $N_{DATA} = N_{TRX} = 1$, a mUE/mWTRU may have a single-beam configuration and/or may operate one beam at a time. One or more of the following may occur. The mUE/mWTRU beamforming may form a narrow beam pattern. FIG. 2K is an example for a 16×16 PAA at the strongest angular direction, e.g., a LOS path obtained from beam measurement. The mUE/mWTRU may form a broad beam pattern, e.g. a wide main lobe. FIG. 2L is an example of a wide main lobe to cover a range of continuous angular directions including strong and/or weak ones in-between. The antenna gain may be reduced considerably with a broad beam pattern, and/or the link budget may worsen.

When $N_{DATA} = 1 < N_{TRX}$, a mUE/mWTRU may have simultaneous beam patterns. The beam patterns may be different and/or may be used for different applications. For example when $N_{TRX} = 2$, a mUE/mWTRU may have (e.g. two) simultaneous beam patterns that are different and/or may be used for different applications. One or more of the following concepts may apply. The mUE/mWTRU may place two narrow beam patterns at different angular incoming directions to receive one data stream. For example, coherent beam combining may be used to utilize the spatial diversity and/or mitigate the blockage effect and/or weak LOS condition. The mUE/mWTRU may form (e.g., one) narrow beam and/or (e.g., one) broad beam for different application. For example, the narrow beam may be used for data transmission and/or the broad beam for control signaling.

When $1 < N_{DATA} = N_{TRX}$, the transmission may apply MIMO to increase the capacity, e.g., in high SNR channel condition. The mUE/mWTRU may place two narrow beam patterns at different angular incoming directions to receive two data streams in parallel.

The SCmB beam forming schemes may include fixed beam, adaptive beam forming (e.g., codebook-based and/or non-codebook-based), and/or classical beam forming, (e.g. Direction-of-Arrival (DoA) estimation). A scheme may use different approaches and work well in certain scenarios. For example the DoA estimation may use smaller angular spread and/or a mUE/mWTRU may (e.g., need to) transmit a LTE uplink reference signal to ensure DoA accuracy. The fixed beam device and/or system may use beam cycling and/or switching.

Although one or more of the examples described herein may be explained in terms that assume are mUE/mWTRU antenna configuration and/or beamforming configuration that is based on a single-beam mUE/mWTRU antenna configuration with analogue beamforming as illustrated in FIG. 2G, the methods and/or techniques may also be applied using other beamforming methods such as digital beamforming and/or hybrid beamforming.

When used herein, the term beam may refer to, among other things, as at least one of the lobes (e.g., main/side/grating lobes) of the transmit radiation pattern and/or receive gain pattern of an antenna array. A beam may also denote a spatial direction that may be represented with a set beamforming weights. A beam may be identified and/or associated with a reference signal, an antenna port, a beam identity (ID), a scrambling sequence number and/or may be transmitted and/or received at a specific time and/or frequency and/or code and/or spatial resources. A beam may be formed digitally, in an analogue manner and/or both (e.g., hybrid beamforming). The analogue beamforming may be based on fixed code-book and/or continuous phase shifting.

When used herein, the term data channel beam may refer to a beam used to transmit data channel, PDSCH, mPDSCH, mmW PDSCH, mmW data channel, directional PDSCH, beamformed data channel, spatial data channel, data channel slice and/or high frequency data channel. A data channel beam may be identified and/or associated with a reference signal, an antenna port, a beam identity (ID), a scrambling sequence number and/or may be transmitted and/or received at a specific time and/or frequency and/or code and/or spatial resources.

When used herein, the term control channel beam may refer to a beam used to transmit control channel, control channel beam, PDCCH, mPDCCH, mmW PDCCH, mmW control channel, directional PDCCH, beamformed control channel, spatial control channel, control channel slice and/or high frequency control channel. A control channel beam may be identified and/or associated with a reference signal, an antenna port, a beam identity (ID), a scrambling sequence number and/or may be transmitted and/or received at a specific time and/or frequency and/or code and/or spatial resources. Control channel beam duration may be a number of OFDM symbols in a TTI occupied by one control channel beam. Control region may be the number of OFDM symbols in a TTI occupied by all the control channel beams transmitted in the TTI.

When used herein, the term measurement beam may refer to a beam used to transmit a signal and/or channel for beam measurement including beam reference signal, beam measurement reference signal, CRS, CSI-RS, CSI-IM, etc. A measurement beam may be identified and/or associated with a reference signal, an antenna port, a beam identity (ID), a scrambling sequence number and/or may be transmitted and/or received at a specific time and/or frequency and/or code and/or spatial resources.

In one or more examples, mB, SCmB, eNB, cell, small cell, Pcell, Scell may be used interchangeably. In one or more examples, operate may be used interchangeably with transmit and/or receive. In one or more examples, component carrier, mmW carrier may be used interchangeably with serving cell.

In one or more examples a UE/WTRU may be substituted for eNB and/or vice versa. In one or more examples UL may be substituted for DL and/or vice versa and still be consistent with the techniques disclosed herein.

In one or more examples, a channel may refer to a frequency band which may have a center and/or carrier frequency and/or a bandwidth. Spectrum may include one or more channels which may or might not overlap. Channel, frequency channel, wireless channel, and/or mmW channel may be used interchangeably. Accessing a channel may be the same as using (e.g., transmitting and/or receiving on and/or using) the channel.

In one or more examples, a channel may refer to an mmW channel and/or signal such as an uplink and/or downlink physical channel and/or signal. Downlink channels and/or signals may include one or more of mmW synchronization signal, mmW broadcast channel, mmW cell reference signal, mmW beam reference signal, mmW beam control channel, mmW beam data channel, mmW hybrid ARQ indicator channel, mmW demodulation reference signal, PSS, SSS, DMRS, CRS, CSI-RS, PBCH, PDCCH, PHICH, EPDCCH, PDSCH, Uplink channels and/or signals may include one or more of mmW PRACH, mmW control channel, mmW data channel, mmW beam reference signal, mmW demodulation reference signal, PRACH, PUCCH, SRS, DMRS and/or PUSCH. Channel and mmW channel may be used interchangeably. Channels and signals may be used interchangeably. PRACH and preamble may be used interchangeably.

In some scenarios, data/control may mean data and/or control signals and/or channels. Control may include synchronization. The data/control may be mmW data/control. Data/control and data/control channels and/or signals may be used interchangeably. Channels and signals may be used interchangeably. The terms control channel, control channel beam, PDCCH, mPDCCH, mmW PDCCH, mmW control channel, directional PDCCH, beamformed control channel, spatial control channel, control channel slice, high frequency control channel may be used interchangeably. The terms data channel, data channel beam, PDSCH, mPDSCH, mmW PDSCH, mmW data channel, directional PDSCH, beamformed data channel, spatial data channel, data channel slice, high frequency data channel may be used interchangeably.

In one or more examples channel resources may be resources (e.g., 3GPP LTE and/or LTE-A resources) such as time and/or frequency and/or code and/or spatial resources which may, e.g., at least sometimes, carry one or more channels and/or signals. In one or more examples, channel resources may be used interchangeably with channels and/or signals.

A mmW beam reference signal, mmW reference resource for beam measurement, mmW measurement reference signal, mmW channel state measurement reference signal, mmW demodulation reference signal, mmW sounding reference signal, reference signal, CSI-RS, CRS, DM-RS, DRS, measurement reference signal, reference resource for measurement, CSI-IM, and measurement RS may be used interchangeably. The terms mmW cell, mmW small cell, SCell, secondary cell, license-assisted cell, unlicensed cell, and LAA cell may be used interchangeably. mmW cell, mmW small cell, PCell, primary cell, LTE cell, and licensed cell may be used interchangeably. Interference and interference plus noise may be used interchangeably.

A UE may determine the UL and/or DL directions of one or more subframes according to one or more received and/or configured TDD UL/DL configurations. UL/DL and UL-DL may be used interchangeably.

In some scenarios, transmit power, power, antenna array transmit power may be used interchangeably. In some embodiment, cmW and mmW may be used interchangeably.

To meet the high data rate required for the next generation of cellular communication device and/or systems, the large bandwidths available at above-6 GHz frequencies, e.g. at cmW and/or mmW frequencies, may be used for communications.

The large bandwidth available at these frequencies may provide enormous capacity improvement for user-specific data transmission. One challenge of using these above-6 GHz frequencies may be characteristics related to their propagation which may be unfavorable for wireless communication, especially in an outdoor environment. For example, higher frequency transmissions may experience higher free space path loss. Rainfall and/or atmospheric gasses, e.g., oxygen, may add further attenuation and/or foliage may cause attenuation and/or depolarization. Narrow beam patterns which may be used to counter these losses may pose challenges for a base station (e.g., eNB), for example in delivering cell-specific and/or broadcast information. Initial mmW access link device and/or system design may focus on cellular system procedures that enable add-on mmW data transmission (e.g., at least downlink transmission) to an existing network such as a small cell LTE network.

A multi-hop scenario may occur, for example, when an mB attempts to reach a gateway mB through one or more wireless hops in a wireless mesh topology. A multi-hop scenario may increase latency for data communications. Reduced latency associated with data forwarding in a multi-hop environment may be provided. Use cases may include applications that may find useful (e.g., may be in need of) ultra-low latency data transmission and/or reception in a multi-hop network, such as 5G tactile internet and/or fronthaul communications.

Wireless Multi-hop networks may suffer delays associated with sequential hop-by-hop forwarding of wireless packets throughout the network. Delay may be a function of the number of hops and/or packet size. An increase in packet size and/or the number of hops between a source and/or destination may increase the delay of a data packet, causing an increased latency in corresponding data communications. Latency may be reduced in multi-hop wireless data transmission and/or reception.

Wireless packets may contain (among other things) a coded data field. Coding in a data field may be used in a wireless channel, e.g., to increase data rates at a cost of latency. Longer code words may perform better, although (e.g. for practical reasons) a data field may comprise one or more, or multiple, codewords (CWs). Data protection from interleaving across a field may (e.g. also) be used at a cost of (e.g. additional) latency. Data integrity may be provided, e.g., with a CRC and/or FCS across the data field. Codewords in a wireless packet may be decoded and/or a CRC may be checked before forwarding, which may increase latency.

Fast Forwarding Using CW without per-CW CRC may be provided. Wireless packets targeted for fast forward (FF) may be divided into one or more, or multiple, (e.g. many) independently decodable codewords. One or more packets may be received and/or forwarded using codeword-based approach, for example, instead of a packet-based approach at MAC layer and/or higher. For example, a packet may use none or (e.g. only) limited field-wide interleaving in a data field, for example, so that CWs may be decoded before the whole/full packet is received. For example, CWs may be processed in a forward error correction (FEC) decoder as a wireless packet is received in a radio port. A CW may be forwarded to an outgoing radio port Tx queue, for example, once the CW is validated.

The channel decoder (e.g., a LDPC decoder) may perform iterative decoding of the incoming one or more CWs. At one or more, or each, decoding iteration, a syndrome may be computed, for example. A non-zero syndrome after one or more, or multiple (e.g., many) iterations may indicate decoding error. A decoding error may be detected earlier, perhaps for example if the syndrome value does not change from one decoding iteration to the next. For example, if a same modulation and coding scheme (MCS) is used on the incoming and outgoing links, then the CW(s) might not be re-encoded. For example, where one or more different MCSs may be used on the incoming and/or outgoing links, decoding followed by re-encoding may be useful. Stated somewhat differently, the one or more CWs may be independently verifiable and/or error-detectable, even without an attached/corresponding CRC. Some amount of buffering may be useful, perhaps for example if an incoming link MCS is lower than outgoing link MCS.

A packet may include a PHY header in some devices and/or systems. A Tx PHY header for the outgoing next hop may be constructed, for example, (e.g. shortly) after reception of the incoming PHY header and/or before the start of transmission in the next hop.

Figure 3:
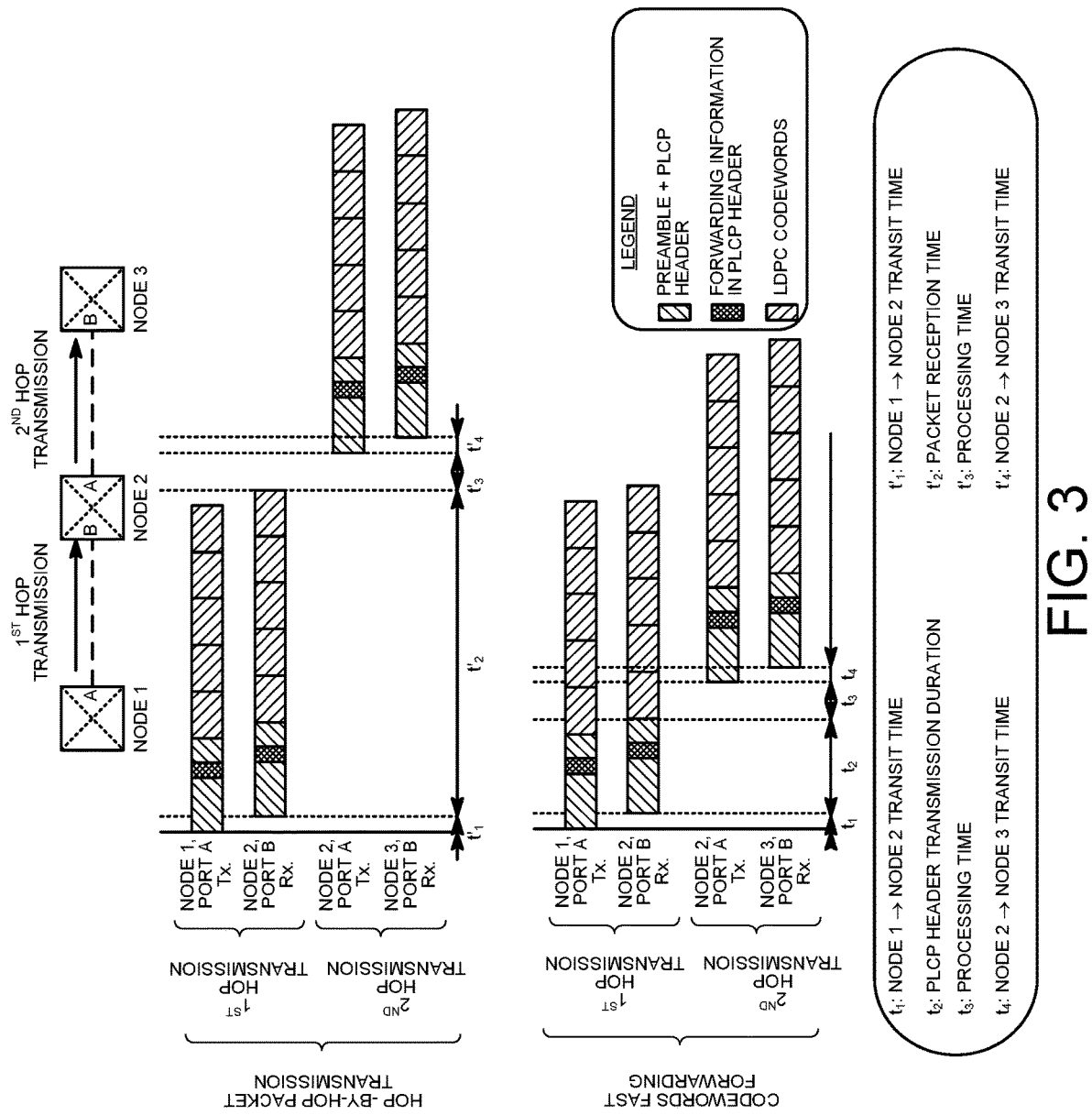
FIG. 3 illustrates an example of fast forward compared to a packet-by-packet forwarding scheme.

Radio resources may be scheduled end to end, for example, through an access and/or wireless transport network. Ingress traffic may be inspected, e.g., to determine whether there is an indication that it is FF traffic. An indication, for example, may be part of the packet itself (e.g. in a PHY and/or MAC header) and/or may be configured in advance by an out-of-band control plane. Qualifying packets may be decomposed into CWs that may be transmitted in the next hop, for example, as soon as the destination is determined without waiting for the entire packet's arrival (e.g., before full receipt of the entire packet) and/or CRC verification. Data transmission at an outgoing (transmitting) radio/port may start before an entire packet reception is completed at an incoming (receiving) radio/port. CRC may be attached (e.g. only) at a packet level. A CRC might not be attached for one or more, or each, codeword. Intermediate metrics in a decoder may be used, for example, when using codes such as Low Density Parity Check (LDPC), e.g., such that the probability of determining the correctness of a particular CW may be high. Protocols may be implemented for retransmissions based on CW decoding failures. For example, a packet-wide CRC/FCS may be maintained, e.g., so that a per-packet integrity check may be performed. FIG. 3 is an example of fast forward compared to a packet-by-packet forwarding scheme.

Figure 4:
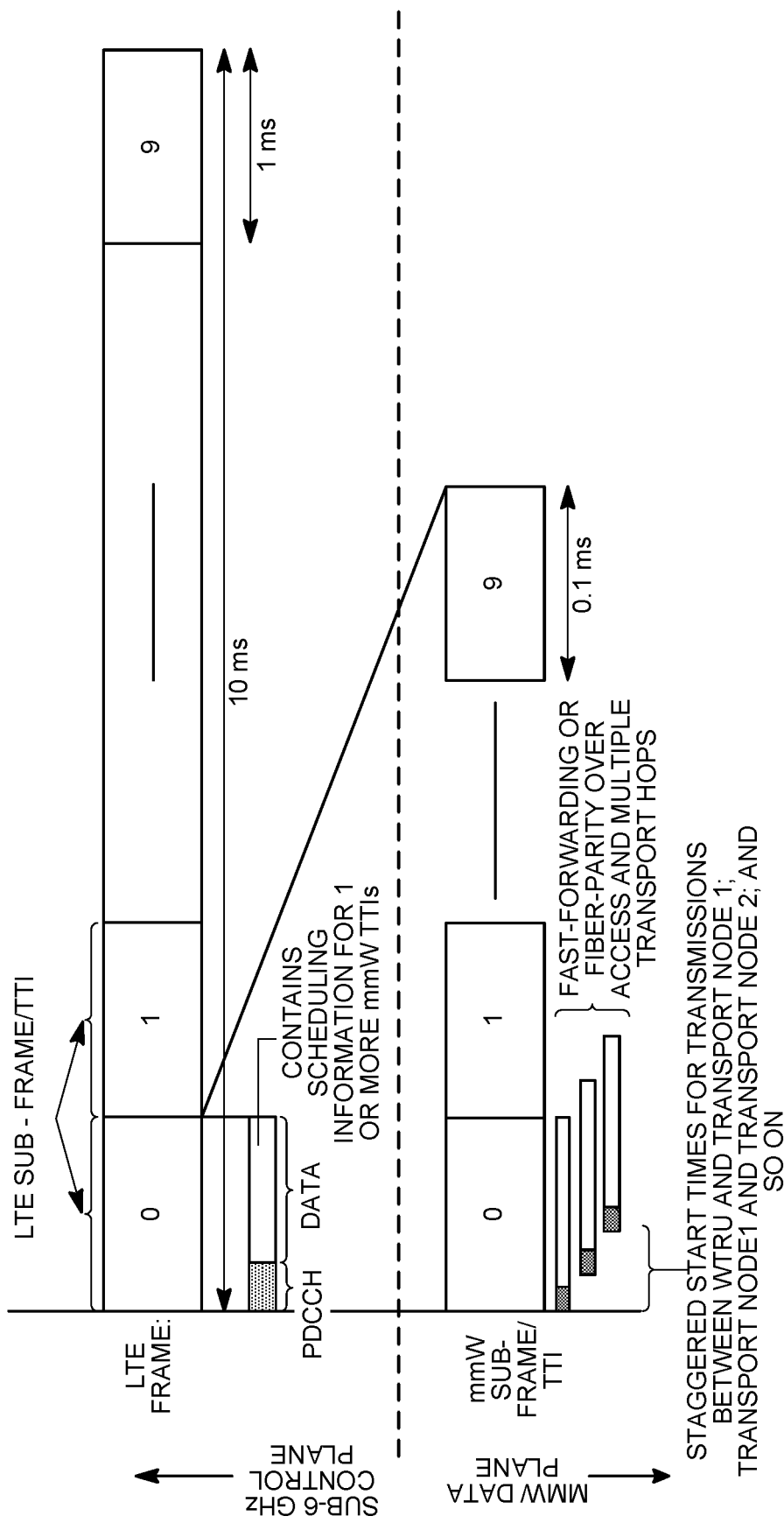
FIG. 4 illustrates an example of a mmW frame structure for fast forwarding aligned with an LTE based control plane overlay.

FIG. 4 is an example of a mmW frame structure for fast forwarding aligned with an LTE based control plane overlay. The duration of LTE and/or LTE-A frames may be, for example, 10 ms with TTI sub-frame intervals 1 ms each. FIG. 4 shows an example of the frame structure for sub-6 GHz and/or mmW planes. A portion of an LTE carrier may be reserved for mmW control messaging. A TTI duration for a mmW plane may be (e.g. significantly) shorter than that of an LTE control plane, for example, due to the larger bandwidth of mmW communications. An (e.g. one or more, or each) LTE sub-frame and/or TTI may include one or more, or multiple, (e.g. 10) individual mmW sub-frames (and/or TTIs) (e.g. one or more, or each, 0.1 ms or 100 us in duration), for example, to maintain synchronization between the LTE control plane and the mmW data plane. Synchronization may be maintained on control and/or data planes, e.g., by a network controller.

A mmW data plane may map neatly to Ethernet frames. For example, there may be a 1:1 mapping of Ethernet frames to wireless packets. A (e.g. one or more, or each) Ethernet frame (e.g. in a 1:1 mapping) may be the full payload of a (e.g. one or more, or each) wireless packet, which may simplify forwarding decisions. CWs corresponding to a (e.g. one or more, or each) frame may be aggregated together into a (e.g., single) packet with a (e.g., single) header and/or preamble, for example, when there are one or more, or multiple, Ethernet frames in a Tx queue belonging to the same flow.

A PHY preamble may comprise pilot sequences that may be used for packet detection, fine timing and/or frequency correction and/or link quality estimation. Pilot sequences may be a 128 sample Golay sequence. A CE preamble may comprise two complementary 512-sample Golay sequences. First pilot field(s) of the preamble may be coded, for example, to indicate whether a packet is FF and/or a radio port to forward on (e.g. so a receiver can prepare for the next hop). In an (e.g. another) example, a packet designation may indicate low-latency and/or high latency, for example, by the order of two sequences in a CE preamble. Preamble designation of latency priority may reduce packet processing latency, for example, by enabling the transport node to identify latency requirements without decoding the header the radio (and/or Ethernet) port used in the next hop. Flow IDs may be (e.g., relatively) small and/or may be reused in different parts of a wireless mesh, reducing overhead, for example, given that a wireless mesh might not be arbitrarily large and/or routing of the data plane may be to/from GW nodes.

Additional information may be included in a PLCP Header, such as traffic type (e.g. low latency traffic and/or normal traffic), frame type (e.g. Data, Control and/or Management) and/or aggregation type (e.g. A-MSDU/A-MPDU/A-PPDU).

A PHY/PLCP header may contain one or more fields for operation of one or more Fast-Forward retransmission procedures. Information relevant to data recovery and/or proper PHY operation may be maintained via a sub-6 GHz LTE control plane. A PHY/PLCP header may, for example, be encoded more robustly relative to a MAC payload that follows the header and may contain its own Header Check Sequence (HCS). Table 1 shows examples of fields in a PHY/PLCP header. For example, Table 1 may show an example of a mmW low-latency PHY packet header format, e.g., for an initial transmission.

TABLE 1

| No. | Element | No. of bits | Description |
|---|---|---|---|
| 1 | New/Re-transmission | 1 | Indicates if the packet is a new transmission or re-transmission |
| 2 | Length | 15 | Packet length in bytes for a new packet transmission. For ACK frame this value is 0. If this is a re-transmitted codeword, it indicates the number of the 1st CW in the re-transmitted sequence of CWs in the packet (determined by the NACK info from a previous failed packet) Alternatively an 8 and 7 bit field is constructed from the 15 bits. 1st field indicates the 1st CW, 2nd field indicates the 2nd CW and then continues with the remainder of the sequence of CWs. |
| 3 | Low latency packet type | 2 | Indicates low-latency transmission mode (00: FF; 01: FP; 10: ACK/NACK) |
| 4 | Session ID | 8 | Identifies the FF session. Similar to CE S-Tag. |
| 5 | Sequence No. | 2 | Packet sequence number to re-transmitted fragments from different packets. |
| 6 | Header Check Sequence | 16 | |
| 7 | Reserve | 4 | |
| | TOTAL bits | 48 | | and/or payload. For example, the extra time provided by advance warning of a FF packet may be used (e.g. by the next hop transmitter) to (e.g. gracefully) terminate an ongoing transmission and/or to stall a pending transmission to make and/or otherwise ensure radio resources may be (e.g. will) be available for a FF packet in the next hop.

Forward information may be provided, for example, by control and/or header implementations. For example, a PLCP Header/PDCCH may contain forwarding information that may allow a receiving node to start forming the packet for next hop before receiving an entire MAC frame. Forwarding information may comprise, for example, a C/S-VLAN ID and/or similar packet label derived from higher layers. An out-of-band control plane may (e.g. alternatively) indicate a Flow ID that endpoints should use when generating FF traffic. For example, data generating nodes may be given a flow ID for a session and/or the Flow ID may be included in the header, for example, when a FF session is established. A (e.g. one or more, or each) flow of packets may be assigned a flow ID and/or packets may have a sequence number, e.g., to allow reconstruction of the retransmitted packets. An intermediate node may have forwarding tables that may use a Flow ID as a key, e.g., to learn Wireless packets for fast forward (FF) may be divided into several independently decodable codewords, for example, to forward data from node to node as fast as possible. Packets may be received, transmitted and/or forwarded using a codeword-based approach (e.g. as compared to packet-based approach) at MAC layer and/or higher. Codeword ID may be inserted for a (e.g. one or more, or each) codeword and/or a per-codeword CRC may (e.g. also) be attached to a (e.g. one or more, or each) codeword.

Data codewords may be forwarded to an outgoing port, for example, as soon as the data codewords are received at the incoming port, e.g., with minimum buffering. Low interference due to mmW beamforming using narrow beams may avoid interleaving across packets, which may allow codewords to be decoded independently. Radio resources may be scheduled end to end through an access and/or wireless transport network. Ingress traffic may be inspected, e.g., to determine whether the traffic satisfies predetermined criteria for FF. Qualifying packets may be decomposed into (e.g. small) codewords (CWs). CWs may be transmitted in the next hop, for example, as soon as the reception of codeword is successful at the current node. A destination node in next hop may be determined, for example, without waiting for the entire packet's arrival and/or packet CRC verification. Data transmission at an outgoing radio/port may start before an entire packet reception is completed at a receiving radio/port. A CRC may be attached, e.g., for a (e.g. one or more, or each) packet. A CRC may be attached for a (e.g. one or more, or each) codeword, for example, to ensure that the reception of codeword is correct and/or for use in checking an error whether the corresponding codeword is successfully received or not. For example, a CW-level CRC and/or packet-level CRC may be used. For example, a CW-level CRC may be used while a packet level CRC may be omitted.

Codeword identification may be provided. A packet may contain one or more, or multiple, codewords. A codeword may be identified using an explicit and/or implicit procedure(s). For example, an explicit CW identification may use a bit stream while an implicit CW identification may use CRC masking.

Explicit codeword identification (e.g. using a bit stream) may be provided. A packet may be divided into (e.g. small) codewords. A plurality of (e.g. a few) bits and/or a bit stream may be inserted for a (e.g. one or more, or each small) codeword, for example, to identify the corresponding codeword. Codeword identification (CW ID) may be utilized and/or inserted, for example, after packet division and/or before channel encoding. A CW level CRC may be attached, e.g., after CW ID insertion.

Implicit codeword identification (e.g. using CRC masking) may be provided. A CRC mask may be used, e.g., in addition and/or alternative to inserting bits and/or a bit stream. A codeword-specific mask may be used for a (e.g. one or more, or each) codeword within a packet, for example to identify the codeword. A codeword's CRC may be masked with a CW-specific mask at a transmitter. A codeword may be de-masked (e.g. first before CW level CRC test) at a receiver. For example, codeword #n may be identified, for example, when a codeword is de-masked with CW-specific mask #n and/or a CW CRC test passes.

A frame check sequence may be provided. For example, a fast forwarded codeword may be appended with an N-bit frame check sequence and/or CRC, e.g., to detect errors at the receiving node. For example, an 8-bit frame check sequence (N=8) may detect (e.g. all) one and/or two bit errors in a 672-bit long codeword produced by an 802.11ad LDPC encoder. Increasing a check sequence length to 16 (N=16) may allow (e.g. all) one, two, three and/or four bit errors to be detected. An incoming payload size into channel coding (e.g. LDPC encoder) may be reduced, e.g., to accommodate a PHY frame check sequence.

Fast forwarding procedures may be provided. Low-latency traffic generated from the application layer may be marked in the PHY layer, e.g., via the PHY/PLCP header. A PHY/PLCP header may, e.g., to reduce overhead, have a different format for control information relevant to a fast forwarding operation. A header variant may be identified, for example, via modification of the PHY preamble.

An indication may be provided (e.g. to transport nodes) that a packet may (e.g. will) be fast forwarded over successive hops. For example, a PHY/PLCP may be configured, for example, by setting a field (e.g. <Low Latency Packet Type> field) to indicate fast forward operation. Payload data may be encoded and/or mapped to symbols according to an MCS target for the next hop destination, e.g., as provided by the control plane.

A CRC may be inserted as part of a (e.g. one or more, or each) codeword prior to channel coding. An indication may be provided that a fast-forwarding approach may use (e.g. require) a unique per-CW CRC. An indication may be provided in a PHY/PLCP header. The data of a (e.g. one or more, or each) PHY layer packet may aggregate CWs from Ethernet frames with the same source address (SA) and/or destination address (DA). An SA/DA pair (e.g. accompanied by other parameters such as QoS) may be indicated through a Session ID tag that may populate the <Session ID> field of the PHY/PLCP header. A mapping between SA/DA/QoS and other parameters and/or the Session ID may be designed, for example, in such a way that it is locally unique, e.g., to reduce header overhead. A length of a packet (e.g. in bytes) may populate the <Length> field of the PHY/PLCP header. Data may be transmitted on the next available TTI.

An incoming packets traffic type (e.g. legacy and/or a low-latency traffic) may be designated (e.g. at a transport node), for example, by identification of a preamble variant being transmitted. A latency type may be identified. A PHY/PLCP header may be interpreted according to the identified latency type. Correct identification may be indicated when the CRC check and/or de-masking techniques are completed successfully.

A PHY/PLCP header may be successfully recovered. A transport node may identify the type of low-latency traffic that is being transmitted, e.g., from the <Low Latency Packet Type> of the PHY/PLCP header.

A transport node may regenerate an identical PHY preamble and PHY/PLCP header and/or may fast forward a (e.g. one or more, or each) codeword as they are constructed. For example, a (e.g. one or more, or each) codeword of a data payload may be fully decoded, may be re-encoded, and/or may be mapped to symbols according the MCS of the next hop as provided by the control plane. A (e.g. one or more, or each) CRC may be checked for accurate reception, for example, when per-CW CRC is implemented. A transport node may (e.g. when a codeword is detected to be recovered in error) log the index of an incorrect codeword, which may be sent in a NACK transmission to a previous hop source node. A configured size of a NACK field may support one or more, or multiple, CW NACKs. For example, N CW NACKs may be supported. NACK fields 1 . . . N−1 may be used to indicate specific CWs for retransmission (re-Tx). NACK field N may indicate the beginning of the remainder of the sequence of the CWs to retransmit (re-Tx). For example, a NACK field may support three CWs. A packet may have K CWs. A NACK of {5, 30, 50} may re-Tx CWs 5, 30, 50, 51 . . . , K. Missing codewords may be re-transmitted by the previous node. An ACK may be sent to a previous node (e.g. and/or the packet may be deleted), for example, when all codewords are correctly received at a node.

Hybrid Automatic Repeat Request (HARQ) procedures may be deployed between nodes, (e.g. instead of CW retransmissions), for example, by using synchronous and/or asynchronous schemes with enhanced CW implementations.

Data may be recovered in a same and/or similar manner at destination and/or gateway nodes. An incorrectly recovered codeword may be logged by a destination/gateway node. A destination/gateway node may compute a MAC CRC on payload data, for example, when a packet is fully recovered and/or (e.g. all) codewords are appropriately decoded. A packet retransmission may be implemented from the source address, for example, when a CRC fails.

Low latency traffic may be indicated. Low latency traffic may (e.g. for proper operation) involve the transmission of additional control information, e.g., via a PHY/PLCP header. Not all traffic may be low-latency traffic. Excessive overhead may occur, for example, when a PHY/PLCP header reserves resources for dedicated low-latency fields. Overhead may be reduced, for example, by using PHY/PLCP header variants. A variant of a PHY/PLCP header may be indicated, for example, through modified PHY preamble sequences. In one or more examples of PHY preamble variant signaling, a modification of an 802.11ad standard PHY preamble may be implemented. Low-latency traffic may alter a channel estimation preamble sequence, for example, by reversing the order in which two 512 sample Golay sequences may be appended.

Figure 5:
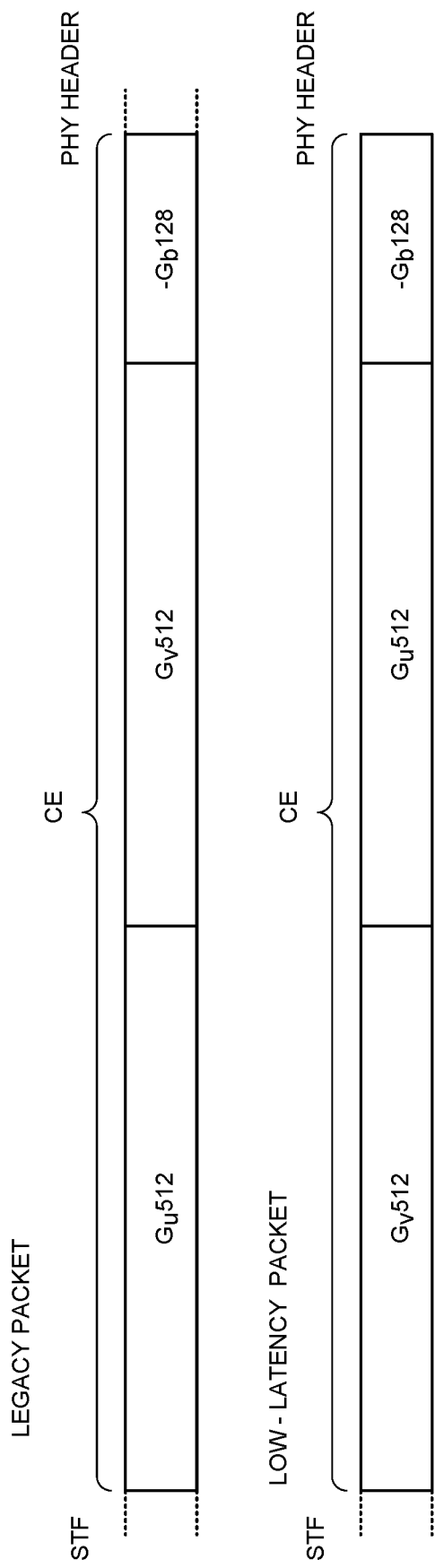
FIG. 5 illustrates an example of Golay sequences.

FIG. 5 is an example of Golay sequences. Incoming packets may be designated (e.g. at a transport node) as legacy and/or low-latency traffic, for example, by identification of the order of Golay sequences in the PHY CE preamble.

Figure 6:
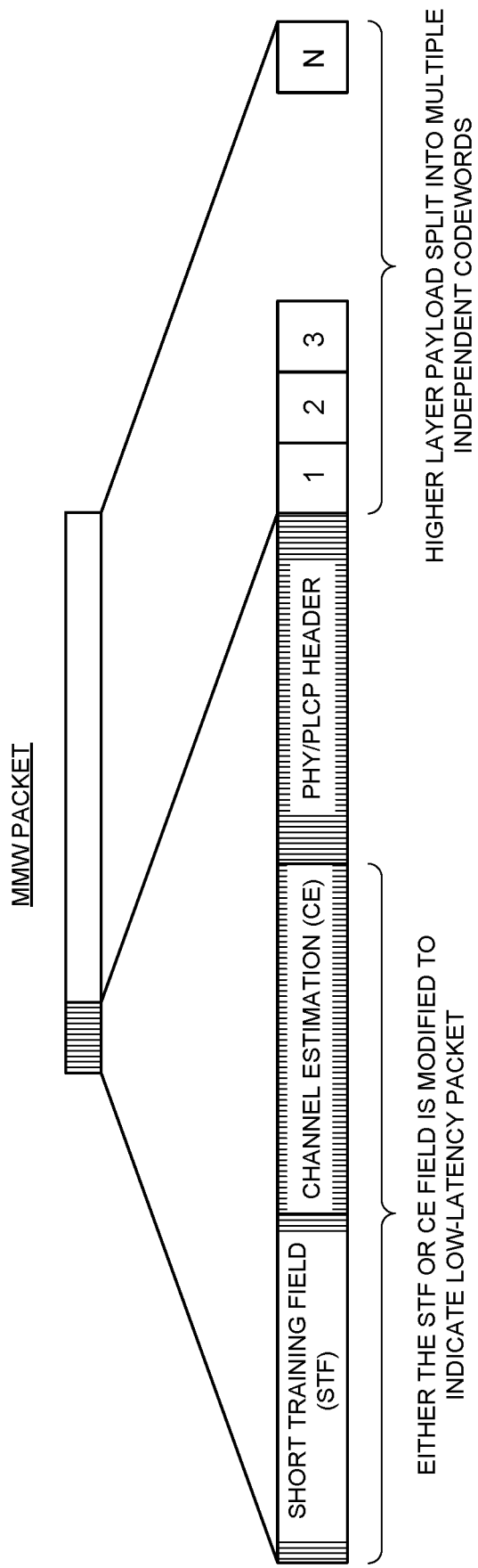
FIG. 6 illustrates an example of a mmW network packet frame structure for low latency traffic.

FIG. 6 is an example of a mmW network packet frame structure for low latency traffic. Proper identification of a PHY preamble (e.g. as low-latency and/or legacy traffic) may indicate the frame format of the PHY/PLCP header and/or may allow for proper reception of a packet.

Error handling may be provided for errors due to missed detection of low latency traffic. Detection of FF traffic using a preamble may have errors. For example, a PHY/PLCP header may be interpreted incorrectly. The interpretation of header fields may be incorrect when a preamble is incorrectly detected, but error handling may permit recovery of the data. Error handling may use CRC masking. For example, a low latency specific CRC may be used and/or masked with PHY/PLCP header. Low latency traffic mistaken as regular traffic and/or other traffic types may fail a regular non-low latency specific CRC de-masking. A receiver may test a CRC for other traffic type, for example, when a first CRC fails to recover from an error in preamble detection.

A variable preamble size may allow transmission efficiency adjustment based on channel condition variations. Channel quality between transport nodes may be fairly static, e.g., given that transport nodes may be fairly stationary. A fixed, large preamble size may be redundant for frequent packet transmissions. A shorter preamble may be used for subsequent packet transmissions after the first transmission. For example, a threshold for determining frequent transmissions may be dependent on specific channel estimation quality, relative mobility and/or other factors. Distinct preamble configurations may be used for a (e.g. one or more, or each) size of a variable preamble, e.g., to distinguish between regular and low latency packets. A packet type (e.g. regular/low latency) may be explicitly signaled in a PHY/PLCP header, for example, when a preamble is eliminated.

Error handling procedures may be provided, e.g., for a buffering scheme, link failure, etc., for one or more scenarios, such as CW without per CW CRC and/or CW with per CW CRC.

In one or more examples of CW without per CW CRC, a (e.g. one or more, or each) data CW received by a node may be decoded by a channel decoder (e.g. LDPC decoder). A CW may be considered received incorrectly, for example, when a decoder indicates an error. A node may send a null CW (e.g., of one or more null CWs) to the next node in the pre-defined route. The next node may detect the null CW, mark the CW as erroneous and/or forward the null CW. A null CW may be forwarded all the way to the destination. A (e.g. one or more, or each) node along the way may record the location of a failed CW and/or may report it to the preceding node using the NACK frame, e.g., after completing packet reception.

Subsequent CWs that come after the detection of a first erroneous CW may be handled in a variety of ways. For example, nodes may continue forwarding CWs to the destination as the CWs are received and/or may insert null CWs for erroneously received CWs. A node reporting NACKs back to a transmitting frame may receive a retransmitted CW for a CW received in error. For example, a node that receives a first bad CW may send a null CW forward and/or might not transmit/forward any other CW until the node receives a retransmitted CW for the CW received in error. A node may resume forwarding correctly received CWs to other nodes in the pre-defined route.

A null CW may be a CW that has the largest hamming distance from (e.g. all) other valid CWs. There may be one or more null CWs in some scenarios.

A forward error correcting scheme may have different ways of indicating an error was detected in a received CW.

In one or more examples of CW with per CW CRC, a (e.g. one or more, or each) data CW received by a node may be decoded by a channel decoder (e.g. LDPC decoder) and/or a CRC test may be performed on the decoded bits. A CW may be considered received incorrectly, for example, when the CRC test fails (e.g. a frame check sequence computed at the receiver does not match the PHY frame check sequence sent by the transmitter). A node may, for example, send a null code word (e.g., as described in a previous example) to the next node in the pre-defined route. A node may (e.g., alternatively), for example, take the decoder output and generate the CRC bits, invert the generated CRC bits and/or append the inverted CRC bits to the systematic bits. This may (e.g. when passed through the encoder) ensure that the CW CRC fails for the next node, which may (e.g. also) record this particular CW as erroneous.

A (e.g. one or more, or each) node along the way may record the location of the failed CW, e.g., to report it to the preceding node using the NACK frame after completing packet reception.

Transmission of subsequent frames after the reception of a first bad CW may, for example, follow a procedure previously described for subsequent CWs that come after the detection of a first erroneous CW.

A hop-by-hop ACK/NACK procedure may be implemented, for example, to reduce re-transmission latency. When a complete packet is received, A receiving node may (e.g. when a complete packet is received) send an ACK/NACK frame to the transmitter depending on the decoding results.

Table 2 and Table 3 show examples of ACK/NACK frame contents. Table 2 provides an example of a mmW low-latency ACK/NACK frame format. Table 3 provides an example of a NACK frame format for up to three specific CW re-transmissions.

A NACK frame may allow missing CWs to be reported, for example, individually and/or as a series. A (e.g. one or more, or each) node may store a copy of a frame, for example, until receiving an ACK from a downstream node. A node may (e.g. upon receiving a NACK frame), re-transmit missing CWs in a new (e.g., "fresh") PHY packet and/or may indicate the re-transmission status using a New/Re-transmission element in the PHY packet header. A Sequence Number may remain the same in a (e.g. all) packet re-transmissions.

A receiving node may send an ACK response, for example, when a low-latency PHY packet is correctly received. A receiving node may respond with a NACK, which may contain fields that identify the first N failed CWs, for example, when there are one or more missing CWs in a received low-latency PHY packet. A receiver may send a NACK containing appropriate values in the Starting CW and/or No. of CWs fields, for example, when there are more than two missing CWs in the preceding transmission. The first two fields in the ACK/NACK frame may, for example, contain identities of any two missing/corrupted CWs in the range indicated by the last remaining fields. This may cause retransmit of CWs that may have been received correctly as they may fall in between CWs that were received in error.

TABLE 2

| No. | Field | No. of bits | Description |
|---|---|---|---|
| 1 | Retransmitted codeword 1 (optional) | 8 | Identifies codeword requiring re-transmission. This may be a compressed value. |
| 2 | Retransmitted codeword 2 (optional) | 8 | Identifies codeword requiring re-transmission. This may be a compressed value. |
| 3 | Starting codeword (optional) | 8 | Identifies the first incorrect CW in a series requiring re-transmission. This may be a compressed value. |
| 4 | No. of codewords (optional) | 8 | Specifies number of CWs starting with Starting CW requiring re-transmission. This may be a compressed value. |

TABLE 3

| | |
|---|---|
| Re-TX CW 1 | Index of $1^{st}$ CW or block of CWs, with errors. This CW or block of CWs nay be requested to be re-TX. |
| Re-TX CW 2 | Index of 2nd CW or block of CWs with errors. This CW or block of CWs nay be requested to be re-TX. |
| Re-TX CW 3 | Index of $3^{rd}$ CW or block of CWs with errors. This CW or block of CWs nay be requested to be re-TX. |
| Remainder of sequence starting at Re-TX CW 4 and/or perhaps a length of the sequence | Index of $4^{th}$ CW or block of CWs, with errors. This may indicate the start of the rest of the packet for re-TX (e.g. when there is no room for other individual CWs). A length may be indicated, e.g., so that the tail of the sequence might not be re-Tx'd (e.g. if not useful and/or needed). |

In one or more examples of retransmitting (e.g. only) the CWs that were received in error, a bit map may be made of (e.g. all) possible CWs that may exist in the packet transmission. A (e.g. one or more, or each) bit of the map may represent a CW. For example, a bit in the map set to 1 may mean a CW was received in error while a bit set to 0 may mean a CW was received correctly. a bit map may be sent back to a transmitting node as a NACK frame format. A transmitting node may retransmit (e.g. only) the CWs indicated in the bit map as being received incorrectly.

A re-transmission policy may be set by a control plane and/or capabilities of a node. A re-transmission might not be the next transmission made by the node, for example, when a NACK is received. For example, a node receiver may have already started processing the next low-latency packet when it receives a NACK from its downstream node. The node may (e.g. first) forward the next/new packet, which may have a different Sequence Number. The node may retransmit the reported missing CWs belonging to the previous packet, for example, after completing new packet transmission. A re-transmitted packet may use the original Sequence Number of the failed packet, for example, so the receiving node can determine which packet CWs belong to.

At a final destination node (e.g. when all CWs have been received by the PHY layer), received CWs may be forwarded to the MAC. A Cyclic Redundancy Check (CRC) may be performed. A MAC re-transmission may be requested by the destination node, for example, when a CRC check fails. This procedure may be unaffected by a PHY low latency procedure.

A control plane overlay based route setup/release may be provided. An SDN Controller (e.g. as shown in the example in FIG. 2) may take into account the capabilities of a (e.g. one or more, or each) node, for example, to create route setup for low latency traffic. Node capabilities may be acquired and/or stored (e.g. in a database), e.g., during mesh network formation. WTRU (e.g. mUE/mWTRU) capabilities may (e.g. also) be stored, e.g., during a discovery phase. An SDN Controller may set up full and/or half duplex approaches, for example, depending upon node capabilities. Full duplex resource allocation may have higher priority for route setup in support of low latency traffic. For example, setting up separate flow directions for Uplink (UL) and/or Downlink (DL) data may reduce packet transfer latency for multi-hop communication devices and/or systems. An SDN Controller may transmit and/or receive control messages via a Sub-6 GHz control plane overlay. TTI length awareness between sub-6 and mmW bands may be utilized. Synchronized TTI boundaries between Sub-6 GHz and mmW bands may enable an SDN controller to determine when control plane messages are received (e.g. by targeted nodes) and/or executed. A control plane overlay may enable unicast messages and/or multicast control. For example, tactile internet based technologies may be used to control an autonomous vehicle. Sending unicast control messages to an individual vehicle may be sufficient. Sending the same message to other vehicles may create latency issues. A multicast messaging approach to inform one or more, or multiple, (e.g. all) vehicles may be performed via a Sub-6 GHz control plane overlay with a (e.g., single) message, which may reduce control messaging latency.

An LTE sub-6 GHz control plane may be synchronized with a mmW data plane e.g., to facilitate proper network control. Synchronization may occur, for example, by synchronous sub-division of LTE sub-frame TTI boundaries for the mmW sub-frame TTI boundaries. Access traffic may initiate on its designated TTI boundary. Packet forwarding might not start on TTI boundaries. Fast forwarding may be performed, for example, under contention as packets are received. Fast forwarding transmissions may be completed prior to the next successive TTI boundary. A network controller may estimate an end-to-end time for low latency traffic, for example, based on packet length, multi-hop link quality and/or resource availability. Establishment of low-latency end-to-end links may be maintained via a network controller, such as using the LTE sub-6 GHz control plane. Network resource reservations may be terminated by a Network Controller, for example, when the pre-scheduled low-latency session ends. A termination may be communicated to (e.g. all) access and/or transport nodes belonging to the session. Communication may occur, for example, over an out-of-band control plane (e.g. using the LTE sub-6 GHz control plane). An mUE/mWTRU may (e.g. alternatively)

send a session termination message to a Network Controller over the LTE sub-6 GHz Control Plane. A Network Controller may (e.g. also) send a message to one or more (e.g. all) participating nodes in the session, e.g., to release channel resources over the LTE sub-6 GHz Control Plane.

A mmW network initialization may be directed by a network controller via the LTE sub-6 GHz control plane. Network initialization may provide scheduling to (e.g. all) mmW nodes, which may set TTI boundaries synchronized with the LTE sub-6 GHz control frame. Address assignment may be performed (e.g. via DHCP). Routes for legacy and/or low-latency traffic may be provided. An mmW IP address space may be mapped to the LTE IP address space, for example, when route coordination may be managed and/or relayed via the LTE sub-6 GHz control plane. An IP address common to both networks may be provided to one or more, or each node, for example, to simplify the procedure. MCS targets may be provided for a (e.g. one or more, or each) link in a network. MCS targets may be estimated from channel state information acquired from mmW node link quality estimates. Beam acquisition operations may (e.g. also) be directed by a network controller for a (e.g. one or more, or each) mmW node's PAA.

A low-latency session initialization request may be sent to a Network Controller over the Sub-6 GHz Control Plane, for example, when an application running on an mUE/mWTRU may find useful (e.g. require) a session for low-latency traffic. A Network Controller may determine an end-to-end route and/or may send routing and/or resource reservation messages to access and/or (e.g. all) transport nodes on an end-to-end path. A request from an mUE/mWTRU may contain a duration of a requested session in which resource reservations and/or routing table updates may remain valid for the duration. Resource reservations may be removed at the end of a requested session. A session end time may (e.g. alternatively) not be specified by an mUE/mWTRU during setup. A session may be explicitly torn down based on an mUE/mWTRU request at a later time.

Network resource reservations may be terminated by a Network Controller, for example, when a pre-scheduled low-latency session ends. A termination may be communicated to one or more (e.g. all) access and/or transport nodes that may belong to a session over the out-of-band control plane. An mUE/mWTRU may (e.g. alternatively) send a session termination message to a Network Controller over a Control Plane. A Network Controller may (e.g. also) send a message to one or more (e.g. all) participating nodes in a session, e.g., to release channel resources over the Sub-6 GHz Control Plane.

Low latency joint access and/or transport may be provided. Enabling low-latency all the way to an end-user may reduce overall RAN latency. Fast-forward utilizing codewords (e.g. as explained herein) may be extensible for an end-to-end radio-access network (RAN) path from an mUE/mWTRU to the last access node in the RAN.

Figure 7:
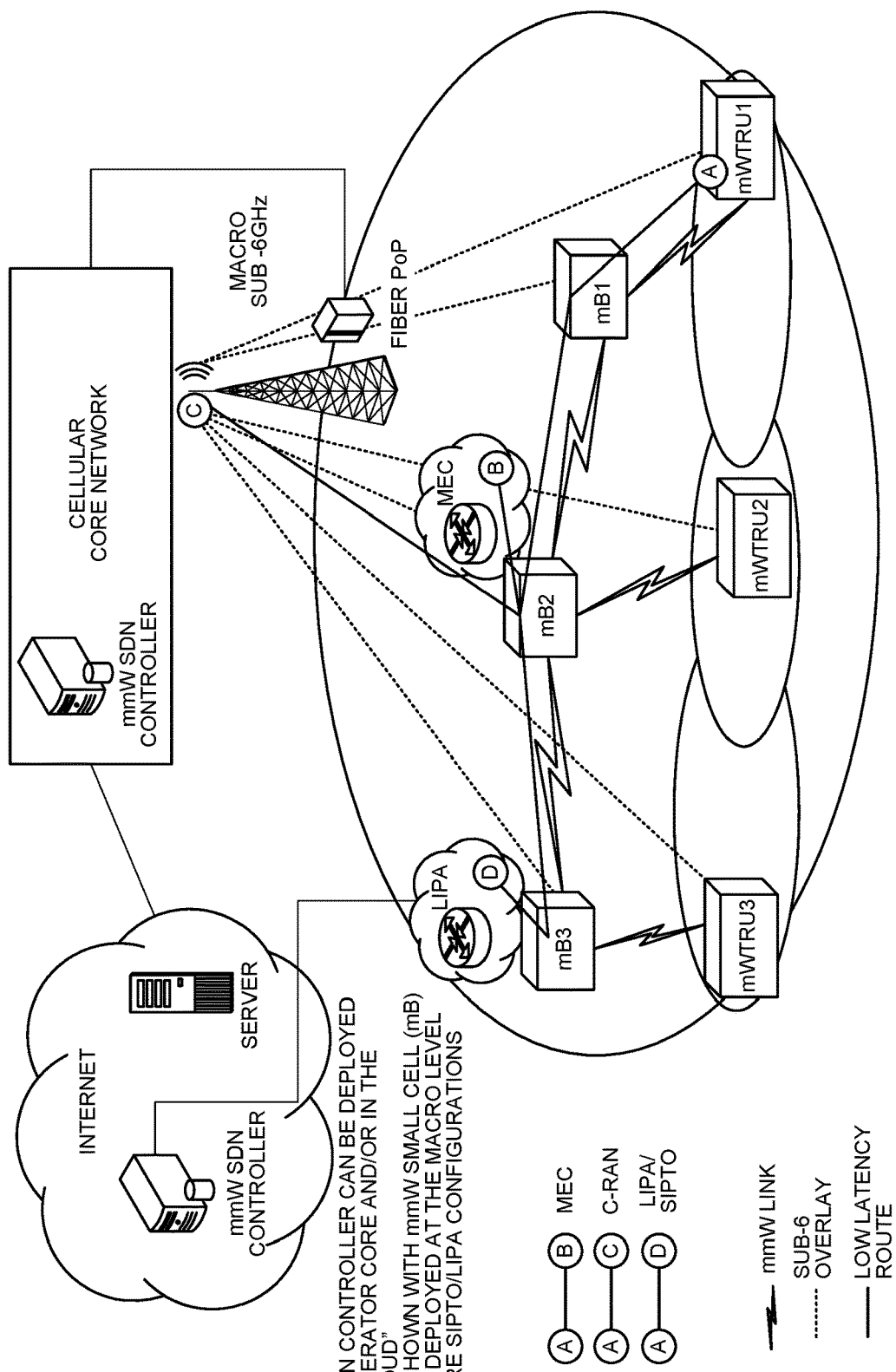
FIG. 7 illustrates an example of enabling end-to-end low-latency.

FIG. 7 illustrates an example of enabling end-to-end low-latency. For example, C-RAN traffic may be communicated from mUE/mWTRU1 to a Macro node, MEC traffic may be communicated from mUE/mWTRU1 to mB2 and/or LIPA/SIPTO traffic may be communicated from mUE1/mWTRU1 to mB3.

Paths/routes taken to destination nodes (e.g. mUE/mWTRU and/or RAN nodes) may vary dynamically. The dotted lines shown in FIG. 7 illustrate some, but not all examples of paths/routes.

Synchronous HARQ may be provided. HARQ may operate utilizing codewords (e.g. as opposed to transport blocks) for retransmissions. For example, a first transmission may be based on a transport block while retransmissions may be based on which codewords are not decoded properly. An implementation may be synchronous.

Data fast forwarding may allow HARQ re-transmissions at a codeword level (e.g. instead of a transport block level). A codeword level HARQ procedure may be provided.

A HARQ entity may be responsible for transmit and/or receive HARQ operations. A transmit HARQ operation may include transmission and/or retransmission of CWs and/or reception and/or processing of ACK/NACK signaling. A receive HARQ operation may include reception of CWs, combining received data and generation of ACK/NACK signaling. One or more, or multiple HARQ processes in parallel may be used to support multi-process 'Stop-And-Wait' (SAW) HARQ operation, for example, to enable continuous transmission while previous CWs are being decoded.

A HARQ entity at a receiver may respond with a CW NACK within $T_{NACK\_Limit}$ from the end of a CW that might not (e.g. cannot) be decoded correctly. Correspondingly, a HARQ entity at a transmitter may wait for $T_{NACK\_Limit}$ duration after transmitting a CW. A HARQ entity may destroy a CW, for example, when a NACK is not received from a receiver. A HARQ entity may (e.g. when a CW NACK is received within $T_{NACK\_Limit}$ from the end of a CW transmission) retransmit the next redundancy version of the CW (e.g. depending on the HARQ redundancy version in use) within $T_{HARQ\_Limit}$ $T_{NACK\_Limit}$ from the end of a transmission of the wrong CW.

Figure 8:
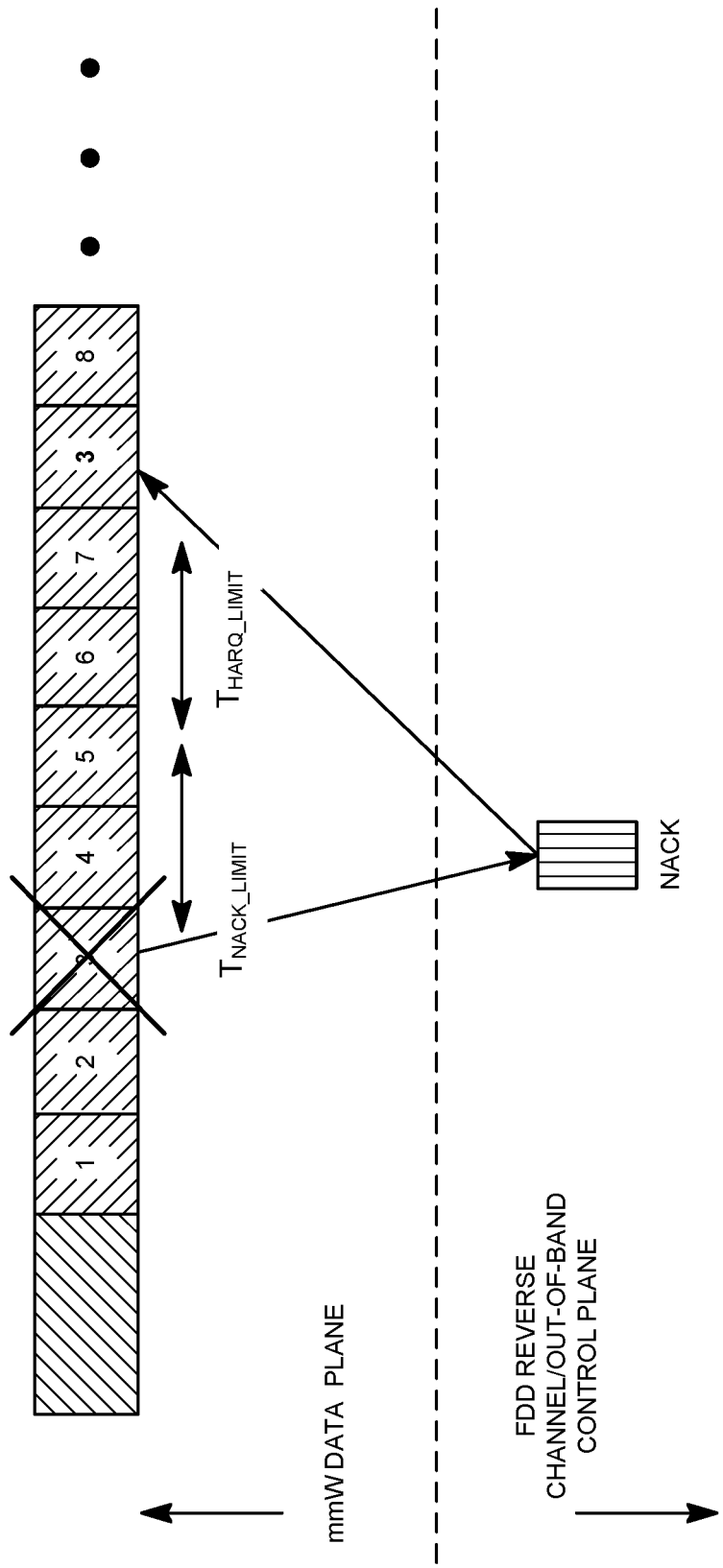
FIG. 8 illustrates an example of synchronous HARQ with codeword operation.

FIG. 8 is an example of synchronous HARQ with codeword operation. A transmission duration of a Transport Block (TB) may be increased, for example, for synchronous HARQ retransmissions.

$T_{NACK\_Limit}$ and/or $T_{HARQ\_Limit}$ may be measured in multiples of CW duration ($T_{CW}$), e.g., for simplicity. $T_{NACK\_Limit}$ and/or $T_{HARQ\_Limit}$ may be given, for example, by Eq. 1 and Eq. 2:

$$T_{NACK\_Limit} = M * T_{CW} \qquad \text{Eq. 1}$$

$$T_{HARQ\_Limit} = N * T_{CW} \qquad \text{Eq. 2}$$

A HARQ entity at a transmitter may maintain (M+N) parallel HARQ processes. A retransmission for a (e.g. one or more, or each) process may occur at a predefined time relative to an initial transmission. Information, such as a HARQ process number, may be inferred from the transmission timing (e.g. as opposed to signaling the information).

Asynchronous HARQ operation might not increase a duration of a Transport Block transmission. ACK/NACK transmission and/or any HARQ retransmissions may, for example, occur after completing an original Transport Block transmission. For example, an ACK/NACK message may be transmitted in TDD fashion, may use a paired FDD channel for transmissions in the reverse direction and/or may use an out-of-band channel for control signaling.

Figure 9:
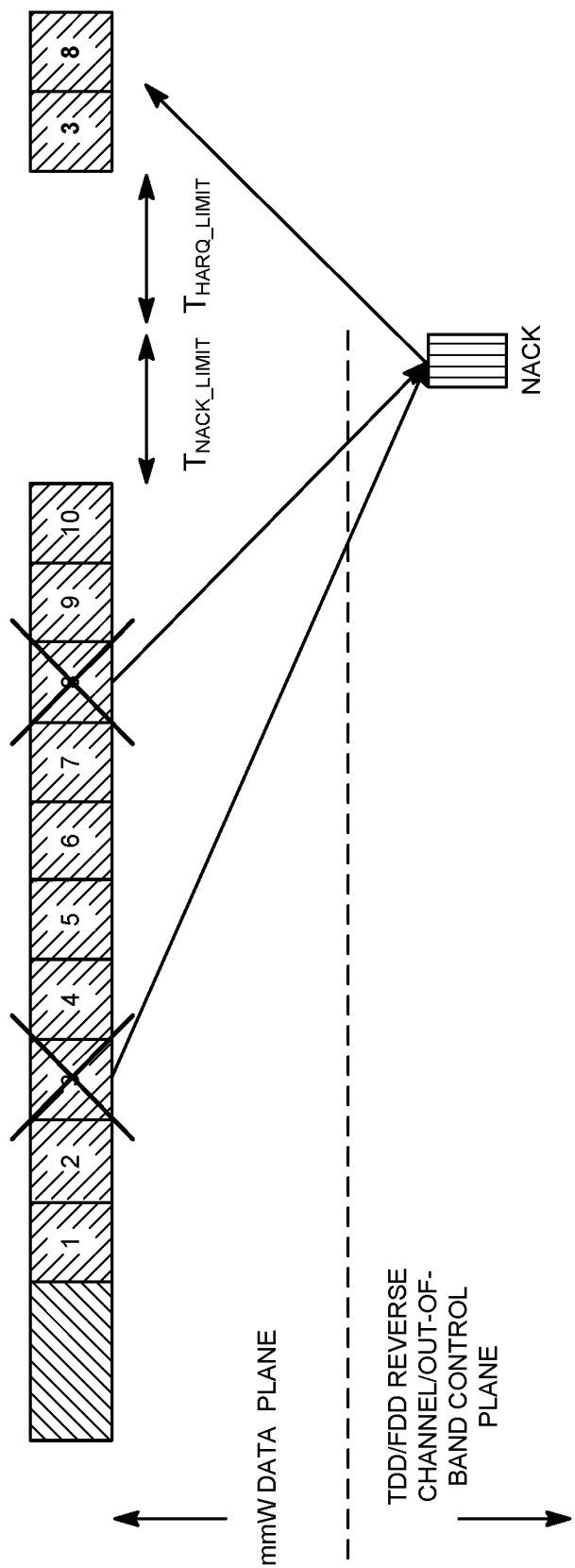
FIG. 9 illustrates an example of asynchronous HARQ with codeword operation.

FIG. 9 is an example of asynchronous HARQ with codeword operation. FIG. 9 shows an example procedure to achieve asynchronous HARQ with codeword operation.

A HARQ entity at a receiver may send a (e.g., single) ACK and/or NACK message after receiving a complete transport block. Failing CWs may be identified as a bitmap and/or via individual sequence numbers.

An ACK/NACK frame transmission may occur within $T_{NACK\_Limit}$ duration from an end of Transport Block reception. A HARQ entity at the transmitter may start a HARQ retransmission within $T_{NACK\_Limit}$ duration from the NACK reception end time. CWs being retransmitted may, for example, be sent in their original order as one block.

A HARQ retransmission delay may be reduced, for example, by sending a separate NACK to a transmitter after one or more, or each failed CW, a procedure that may utilize FDD operation and/or an out-of-band control channel and/or may utilize more control signaling.

Figure 10:
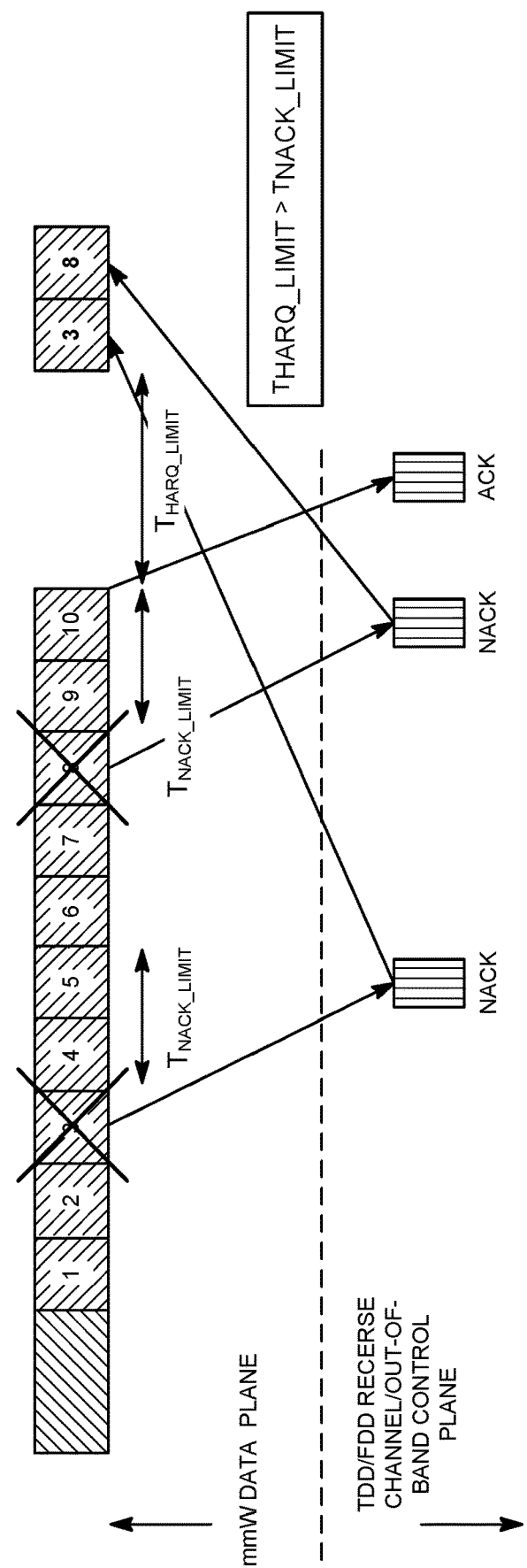
FIG. 10 illustrates an example of asynchronous HARQ with codeword operation.

FIG. 10 is an example of asynchronous HARQ with codeword operation. FIG. 10 shows an example procedure to achieve asynchronous HARQ with codeword operation.

A receiver may send one or more, or multiple, NACKs to a transmitter, e.g., one for one or more, or each failed CW. A NACK may, for example, be sent by a HARQ entity in the receiver within $T_{NACK\_Limit}$ duration after the end of a faulty CW (e.g., within a predetermined period of time following the determination of an erroneous CW). A procedure sending a separate NACK may allow faster turnaround for HARQ retransmissions after end of original transmission (e.g. except when the last CW is received in error). A HARQ entity at a receiver may, for example, transmit an ACK within $T_{NACK\_Limit}$ duration from an end of Transport Block reception, for example, when there are no CW errors in the Transport Block.

A data packet generated in one or more higher layers of the protocol stack (e.g., a transport layer, a network layer, etc.) may include one or more, or multiple Transport Blocks (TBs). One or more Transport Block sizes may be based upon the Transmission Time Interval (TTI) and/or on the chosen Modulation Coding Scheme(s) (MCS). A Transport Block may be decomposed into one or more, or multiple, CWs. A CW length may be determined by the channel encoder (e.g., a LDPC encoder) output block size. A common CW length may be used for one or more, or all, MCSs. This may be achieved by varying the number of encoding bits per CW, for example.

A hybrid HARQ procedure may be implemented, for example, where an original data transmission occurs at a Transport Block level. A NACK sent by a receiving node may identify failing codewords. Subsequent HARQ retransmissions may contain (e.g. only) failing codewords signaled by the receiver and/or their redundancy versions. A receiving node may perform a CRC check on a received Transport Block. A receiving node may (e.g. when a CRC check fails) signal failing codewords in NACK feedback. Failing codewords may be signaled in a NACK, e.g., as a bitmap. An ACK may be sent to a transmitter, for example, when a Transport Block CRC check passes.

Different HARQ mechanisms may be deployed in access and/or transport segments (e.g. depending on device capabilities) in a joint access and/or transport network. For example, a traditional Transport Block level HARQ may be used in an access segment and/or codeword based HARQ deployed in a transport network, for example, when an mUE/mWTRU is not capable of supporting codeword based error signaling.

TTI level provisioning in a network (e.g. mmW network) may be provided. A Macro-node may be responsible for several tens of mBs in a large deployment. A significant amount of control information may be exchanged over a sub-6 layer and/or over a mmW layer, which may lead to network inefficiencies. A distributed control-layer may be implemented, e.g., to reduce inefficiencies.

A distributed control layer may be achieved, for example, via (e.g. pure) distributed and/or hybrid frameworks, such as parent/child SDN control frameworks, clustering techniques where a group of mBs may form a cluster and/or hybrid schemes with a combination of a sub-6 and distributed mmW control framework.

A hybrid control plane architecture may be provided. A distributed control-layer architecture may reduce the amount of control information at sub-6 GHz between a macro eNB, mBs and mUEs/mWTRUs. For example, in one or more architectures, one or more mUE/mWTRUs may request low-latency network resources during a launch of a low-latency application. A request may be carried over a sub-6 GHz control channel to a macro eNB and/or a network controller. A WTRU may request a maximum and/or average data rate, e.g., while requesting low-latency network resources. A WTRU may request a minimum and/or average time period between successive data packet generation by application, e.g., while requesting low-latency network resources. A request may be acknowledged by a macro eNB.

Resource reservation decisions from a network controller may be sent to a macro eNB and/or may be conveyed to associated mBs over a sub-6 GHz control channel. This may provide routing information and/or semi-static resource reservations from an end mB to a Gateway mB. Low-latency traffic multiplexing may be implemented over a portion of and/or an entire route from an end mB to a Gateway mB.

End-to-end resources may be reserved (e.g. semi-statically) and/or routes may be set up (e.g. via sub-6 GHz signaling). Dynamic scheduling messages may be carried, for example, locally between an mUE/mWTRU and an mB via in-band signaling in the mmW channel. An mUE/mWTRU may send in a (e.g. every) TTI its current buffer status report to an mB via mmW band signaling. An mB may send uplink transmission parameters to an mUE/mWTRU, e.g., via a DCI message in a PDCCH in a (e.g. one or more, or each) TTI.

An mB may (e.g. on the transport side) forward low-latency data traffic from an mUE/mWTRU to the next mB, for example, according to previously received routing instructions from the network controller. Changes to low-latency traffic parameters at an mUE/mWTRU may be signaled to a macro eNB (e.g. via sub-6 GHz signaling) and/or updated routing and/or resource allocation information may be sent by a network controller, e.g., through a macro eNB.

A hybrid architecture, e.g., where overall route setup and/or semi-static resource reservation decisions may be taken centrally by a network controller and/or where per-TTI scheduling decisions may be taken locally by individual mBs, may allow a dense deployment configuration, e.g., by reducing sub-6 GHz control signaling, while (e.g. also) providing the usefulness of centralized decision-making.

A control plane architecture may comprise (e.g. only) a mmW band. A low-latency mmW joint access and/or transport network may operate (e.g. solely) in a mmW band. In-band control signaling may simplify network architecture. In one or more mmW-only architectures, for example, a WTRU may send a resource request to an mB via a mmW band message, for example, when an application that utilizes low-latency resources is launched. A message may be aggregated with other data traffic and/or may be stand-alone. A low-latency resource request may be forwarded to a network controller (e.g. via a gateway mB). Forwarding may occur over one or more mmW band hops.

A network controller may determine an optimum end-to-end route from a WTRU to a gateway mB. A network controller may send resource reservation commands to (e.g. all) mBs along the route (e.g. via in-band signaling), which may involve one or more, or multiple, hops from a gateway mB. End-to-end resources may be reserved (e.g. semi-statically) and/or routes may be set up (e.g. via in-band signaling). Dynamic scheduling messages may be carried locally between an mUE/mWTRU and an mB (e.g. via in-band signaling in a mmW channel). An mUE/mWTRU may send in a (e.g. every) TTI its current buffer status report to an mB via mmW band signaling. An mB may end uplink transmission parameters to an mUE/mWTRU, e.g., via a DCI message in a PDCCH in a (e.g. one or more, or each) TTI. An mB may (e.g. on the transport side) forward low-latency data traffic from an mUE/mWTRU to the next mB, e.g., according to previously received routing instructions from a network controller.

Changes to low-latency traffic parameters at an mUE/mWTRU may be signaled to a network controller, for example, via mmW in-band signaling. Updated routing and/or resource allocation information may be sent by a network controller, for example, through a macro eNB and/or mmW transmissions to one or more (e.g. all) mBs along affected routes, which may involve one or more transmission hops.

Non-TTI synchronous operation may be provided. In one or more non-TTI synchronous FF schemes, for example, data flow(s) may have a semi-static end-to-end (e2e) resource reservation (e.g. through a wireless mesh) and/or an out-band overlay control plane covering access nodes (e.g. WTRU) and/or transport nodes. The e2e radio WTRU data resources for WTRU to GW and/or GW to WTRU may be assigned separately, e.g., to minimize access related latency. For example, FF traffic in one or more, or each direction may be via a different route, e.g., so the traffic does not compete for resources. Sharing of mmW resources may be between data and the remaining portion of control on the mmW layer (e.g. ACKs and/or NACKs). A small gap may be reserved for an ACK/NACK response, for example, after a (e.g. one or more, or each) packet is transmitted. Access (e.g. in this configuration) may (e.g. otherwise) be contention free. Resources not used by FF traffic may be used by normal traffic. Normal traffic may be subject to pre-emption, for example, when it uses resources reserved for FF traffic.

For example, FDD and/or full duplex may be supported. A NACK may be sent, for example, as soon as CW failures are detected. For example, a NACK may have one CW index and re-Tx may resume at this (e.g. one) CW.

A generator of traffic for a wireless network (e.g. WTRU and/or GW) may begin sending data as soon as it is available, for example, when the FF resources have been configured and/or transmission may be completed before the resources expire, which may minimize latency related to channel access.

For example, an MCS for a (e.g. one or more, or each) link (including access link) may be set by a central control plane overlay. An MCS may be included in a header.

For example, channel quality reports may be periodically sent to a central controller/overlay and/or may be used (e.g. in part) to set an MCS per link.

For example, e2e radio resources may be set and/or signaled by a central controller/overlay. Signaling may inform a (e.g. one or more, or each) radio of a (e.g. one or more, or each) node, which other nodes to listen to. A listening schedule may contain time, frequency and/or spatial information on a fine time scale. For example, a radio may be instructed to listen to nodes 1 and/or 2 for 50 us, then nodes 2 and/or 3 for 100 us, then nodes 1 and/or 3 for 50 us, then may repeat for 10 ms. For example, a listening schedule may be issued at a lower rate reflecting a lower capacity and/or longer latency of a control plane overlay (e.g. every ~10 ms).

For example, a NACK may include information about which CW(s) failed to decode, e.g., so that the re-Tx may be more efficient. A variable length NACK may be used to list failed CWs. Compression may be used, for example, when they are sorted and/or a max number of them is known. A fixed bit map may (e.g. alternatively) be used for indicating failed CWs. A NACK may have N+1 CW numbers. A first N CW numbers may be per failed CW. A last indicated CW may indicate a re-Tx from CW[N+1] and onwards (e.g. all CWs after the N+1 indicated CW may be re-transmitted).

For example, a forwarding node may forward CWs up to a last good CW, e.g., before sending a null CW. Other CWs after a first failed CW might not be sent until re-transmission(s) supply the rest of the CWs. A CW that triggered a null CW and/or the CWs following it may be re-transmitted, for example, after the one or more failed CWs are assembled with the rest of the packet.

For example, a NACK may be sent after all CWs seem to pass. For example, a NACK with no CWs may be sent. A NACK with no CWs indicated may indicate that all CWs should be retransmitted.

For example, a (e.g. one or more, or each) node may keep (e.g. full) packet data (e.g. until the node gets a full packet ACK from a next hop), for example, to permit retransmission.

For example, a special sequence (e.g. null CW) may be sent in place of a CW up to an N+1th CW (null CW sequence), for example, when a received CW fails (e.g. where forwarding may have started). A next hop may send a special partial packet ACK, for example, when (e.g. all) real CWs are good. An ACK may contain an index of the last good CW and/or index of a null CW. A next hop may (e.g. also) send a NACK for CWs that failed, which might not include CWs replaced by a special sequence.

For example, sequence numbers may be included in a packet header to support one or more, or multiple, failed packets. A (e.g. one or more, or each) retransmission (re-Tx) may be mapped to an appropriate previous failed packet. One or more, or a few, sequence numbers may be useful. For example, two to four bits may suffice. Packets that might not be re-Tx before a sequence number is re-used may be dropped. A drop notification may be piggybacked on the next ACK and/or NACK. A drop notification may be sent on an out-band control plane.

For example, inter-radio Tx forwarding buffer information (e.g. mean delays) may be periodically sent to a central controller and/or may be used to adjust the radio resource scheduling. A (e.g. one or more, or each) forwarding node may compute when it can start a FF transmission, for example, based on the possibly different MCSs used at Rx and/or Tx. Some delay in Tx may occur, for example, when an outgoing MCS may be larger than an incoming MCS.

For example, a central controller may assign a flowID to a (e.g. one or more, or each) FF flow. A Flow ID may be included in a header and/or may be used to key a forwarding table in a node, e.g., so it knows how to forward CWs.

For example, a central controller may update forwarding tables at one or more (e.g. one or more, or each) node that maps flowID to an egress port.

The processes and/or instrumentalities described herein may apply in any combination, may apply to other wireless technologies, and/or for other services.

A WTRU may refer to an identity of the physical device, and/or to the user's identity such as subscription related identities, e.g., MSISDN, SIP URI, etc. WTRU may refer to application-based identities, e.g., user names that may be used per application.

The processes and techniques described herein may be implemented in a computer program, software, and/or firmware incorporated in a computer-readable medium for execution by a computer and/or processor. Examples of computer-readable media include, but are not limited to, electronic signals (transmitted over wired and/or wireless connections) and/or computer-readable storage media. Examples of computer-readable storage media include, but are not limited to, a read only memory (ROM), a random access memory (RAM), a register, cache memory, semiconductor memory devices, magnetic media such as, but not limited to, internal hard disks and removable disks, magneto-optical media, and/or optical media such as CD-ROM disks, and/or digital versatile disks (DVDs). A processor in association with software may be used to implement a radio frequency transceiver for use in a WTRU, terminal, base station, RNC, and/or any host computer.

What is claimed is:

1. A base station in communication with a communication network, the base station comprising:
   a memory;
   a receiver, the receiver configured at least to:
      receive a transmission of a packet from a first node, wherein the packet comprises a first codeword (CW) and a second CW;
   a processor, the processor configured at least to:
      determine an error associated with the first CW; and
   a transmitter, the transmitter configured at least to:
      transmit a null CW based on the determined error, wherein the null CW is transmitted as a replacement for the first CW, wherein the null CW is transmitted to a second node before the second CW is decoded, and the first node and the second node are different.

2. The base station of claim 1, wherein the first CW comprises Low Density Parity Check (LDPC) codes.

3. The base station of claim 1, wherein the packet comprises a plurality of CWs, the plurality of CWs comprising the first CW and the second CW, and the processor is further configured such that the null CW has a largest hamming distance from non-erroneous CWs of the plurality of CWs.

4. The base station of claim 1, wherein the packet comprises a header comprising an indication that the packet is eligible for fast forwarding.

5. The base station of claim 4, wherein the header is at least one of: a Physical (PHY) header, or a Medium Access Control (MAC) header.

6. The base station of claim 4, wherein the packet comprises a plurality of CWs, the header is a Physical (PHY) header, and the receiver is further configured to receive a transmission Physical (Tx PHY) header for the plurality of CWs prior to receiving the plurality of CWs.

7. The base station of claim 1, wherein the packet comprises a plurality of CWs, and a cyclic redundancy check (CRC) is associated with the plurality of CWs for a per-packet-based integrity determination.

8. The base station of claim 1, wherein the second CW is independently verifiable without a cyclic redundancy check (CRC).

9. The base station of claim 1, wherein the second CW is independently decodable, and the second CW is not cyclic redundancy check (CRC) verified.

10. The base station of claim 1, wherein the second CW is cyclic redundancy check (CRC) verified.

11. The base station of claim 1, wherein the packet comprises a plurality of CWs, and the processor is further configured to:
   initiate a decoding of the plurality of CWs; and
   determine that the first CW is a first erroneous CW of the plurality of CWs, wherein each CW of the plurality of CWs that is decoded before the first CW is non-erroneous.

12. The base station of claim 1, wherein the packet comprises a plurality of CWs, and the processor is further configured to record a location of the first CW relative to remaining CWs of the plurality of CWs.

13. The base station of claim 1, wherein the processor is further configured to initiate the transmission of the null CW to the second node as the replacement for the first CW associated with the error.

14. The base station of claim 1, wherein the processor is further configured to initiate a transmission of a negative acknowledgement (NACK) to the first node for the first CW associated with the error, and the transmitter is further configured to transmit the NACK to the first node.

15. The base station of claim 1, wherein the communication network is at least one of: an access network, a front-haul network, or a backhaul network.

16. A method performed by a base station, comprising:
   receiving a transmission of a packet from a first node, wherein the packet comprises a first codeword (CW) and a second CW;
   determining an error associated with the first CW; and
   transmitting a null CW based on the determined error, wherein the null CW is transmitted as a replacement for the first CW, wherein the null CW is transmitted to a second node before the second CW is decoded, and the first node and the second node are different.

17. The method of claim 16, wherein the second CW is independently decodable, and the second CW is not cyclic redundancy check (CRC) verified.

18. The method of claim 16, wherein the second CW is cyclic redundancy check (CRC) verified.

* * * * *